United States Patent
Sheikholeslami et al.

(10) Patent No.: US 11,522,556 B1
(45) Date of Patent: Dec. 6, 2022

(54) NOISE-SHAPING SUCCESSIVE APPROXIMATION REGISTER (SAR) ANALOG-TO-DIGITAL CONVERTER

(71) Applicant: QUALCOMM Incorporated, San Diego, CA (US)

(72) Inventors: Behzad Sheikholeslami, Cambridge (GB); Marceline Kelly Tchambake Yapti, Cambridge (GB); Prateek Tripathi, London (GB); Hongying Wang, Cambridge (GB)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/385,709

(22) Filed: Jul. 26, 2021

(51) Int. Cl.
*H03M 1/12* (2006.01)
*H03M 1/46* (2006.01)
*H03M 1/08* (2006.01)

(52) U.S. Cl.
CPC .............. *H03M 1/468* (2013.01); *H03M 1/08* (2013.01); *H03M 1/1245* (2013.01); *H03M 1/462* (2013.01)

(58) Field of Classification Search
CPC ...... H03M 1/468; H03M 1/08; H03M 1/1245; H03M 1/462
USPC ........................................ 341/172, 155, 144
See application file for complete search history.

(56) References Cited

U.S. PATENT DOCUMENTS

| | | |
|---|---|---|
| 8,102,292 B1 | 1/2012 | Van Ess |
| 9,369,140 B1 | 6/2016 | Sundaresan et al. |
| 9,425,818 B1 | 8/2016 | Rajaee et al. |
| 9,455,733 B1 | 9/2016 | Wu |

(Continued)

FOREIGN PATENT DOCUMENTS

| | | |
|---|---|---|
| CN | 109936369 A | 6/2019 |
| TW | I422160 B | 1/2014 |
| TW | 201824753 A | 7/2018 |

OTHER PUBLICATIONS

Muhlestein J., et al., "A 73dB SNDR 20MS/s 1.28mW SAR-TDC Using Hybrid Two-Step Quantization", 2017 IEEE Custom Integrated Circuits Conference (CICC), IEEE, Apr. 30, 2017 (Apr. 30, 2017), 4 Pages, XP033130630, DOI: 10.1109/CICC.2017.7993701 figures 1-3 abstract p. 1, left-hand column, line 16—p. 4, left-hand column, line 20.

(Continued)

*Primary Examiner* — Peguy Jean Pierre
(74) *Attorney, Agent, or Firm* — Loza & Loza, LLP

(57) ABSTRACT

In certain aspects, an analog-to-digital converter (ADC) includes a comparator having a first input, a second input, and an output. The ADC also includes a digital-to-analog converter (DAC) coupled to the first input of the comparator, a switching circuit, a first capacitor coupled between the first input of the comparator and the switching circuit, a second capacitor coupled between the first input of the comparator and the switching circuit, and an amplifying circuit having an input and an output, wherein the input of the amplifying circuit is coupled to the switching circuit. The ADC further (Continued)

includes a first switch coupled between the output of the amplifying circuit and the DAC, and a successive approximation register (SAR) having an input and an output, wherein the input of the SAR is coupled to the output of the comparator, and the output of the SAR is coupled to the DAC.

27 Claims, 17 Drawing Sheets

(56) References Cited

U.S. PATENT DOCUMENTS

| | | |
|---|---|---|
| 9,685,974 B1 | 6/2017 | Sugimoto et al. |
| 9,698,805 B1 | 7/2017 | Bandyopadhyay |
| 10,498,353 B2 | 12/2019 | Huang et al. |
| 10,784,883 B1 | 9/2020 | Tripathi et al. |
| 10,979,059 B1 | 4/2021 | Shalmani et al. |
| 11,196,434 B1 | 12/2021 | Sun |
| 2010/0001892 A1 | 1/2010 | Aruga et al. |
| 2010/0164761 A1 | 7/2010 | Wan et al. |
| 2012/0286981 A1 | 11/2012 | Satarzadeh et al. |
| 2014/0070972 A1 | 3/2014 | Morgado et al. |
| 2017/0353192 A1 | 12/2017 | Tsai et al. |
| 2020/0106454 A1* | 4/2020 | Chang ............... H03M 1/462 |
| 2020/0119744 A1* | 4/2020 | Lin .................. H03M 1/0854 |

OTHER PUBLICATIONS

Chen Z., et al., "A 9.35-ENOB, 14.8 fJ/conv.-step Fully-Passive Noise-Shaping SAR ADC", Symposia on VLSI Technology and Circuits, 2015, 27 pages.

* cited by examiner

NOISE-SHAPING SUCCESSIVE APPROXIMATION REGISTER (SAR) ANALOG-TO-DIGITAL CONVERTER

BACKGROUND

Field

Aspects of the present disclosure relate generally to analog-to-digital converters (ADCs), and more particularly, to successive approximation ADCs.

Background

An analog-to-digital converter (ADC) is used to convert an analog signal into a digital signal. One type of ADC is the successive approximation ADC, which converts an analog signal into a digital signal using successive digital approximation. ADCs have become popular for implementing low-power ADCs in advanced technologies.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an analog-to-digital converter (ADC). The ADC includes a comparator having a first input, a second input, and an output. The ADC also includes a digital-to-analog converter (DAC) coupled to the first input of the comparator, a switching circuit, a first capacitor coupled between the first input of the comparator and the switching circuit, a second capacitor coupled between the first input of the comparator and the switching circuit, and an amplifying circuit having an input and an output, wherein the input of the amplifying circuit is coupled to the switching circuit. The ADC further includes a first switch coupled between the output of the amplifying circuit and the DAC, and a successive approximation register (SAR) having an input and an output, wherein the input of the SAR is coupled to the output of the comparator, and the output of the SAR is coupled to the DAC.

A second aspect relates to a system. The system includes an analog-to-digital converter (ADC). The ADC includes a comparator having a first input, a second input, and an output, a digital-to-analog converter (DAC) coupled to an input of the ADC and the first input of the comparator, a switching circuit coupled to the input of the ADC, a first capacitor coupled between the first input of the comparator and the switching circuit, a second capacitor coupled between the first input of the comparator and the switching circuit, an amplifying circuit having an input and an output, wherein the input of the amplifying circuit is coupled to the switching circuit, a first switch coupled between the output of the amplifying circuit and the DAC, and a successive approximation register (SAR) having an input, a first output, and a second output, wherein the input of the SAR is coupled to the output of the comparator, the first output of the SAR is coupled to the DAC, and the second output is coupled to an output of the ADC. The system also includes a receiver coupled to the input of the ADC, and a processor coupled to the output of the ADC.

A third aspect relates to a method for noise shaping in an analog-to-digital converter (ADC). The ADC includes a digital-to-analog converter (DAC) having an output, a comparator having a first input coupled to the output of the DAC and a second input coupled to a common mode voltage or a ground, a first capacitor, and an amplifying circuit. The method includes, during a first sampling phase, coupling the first capacitor between an output of the DAC and an input of the ADC, during a first conversion phase, coupling the first capacitor between the output of the DAC and a ground, and, during a second sampling phase, coupling the first capacitor between the output of the DAC and an input of the amplifying circuit, and coupling an output of the amplifying circuit to the output of the DAC.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
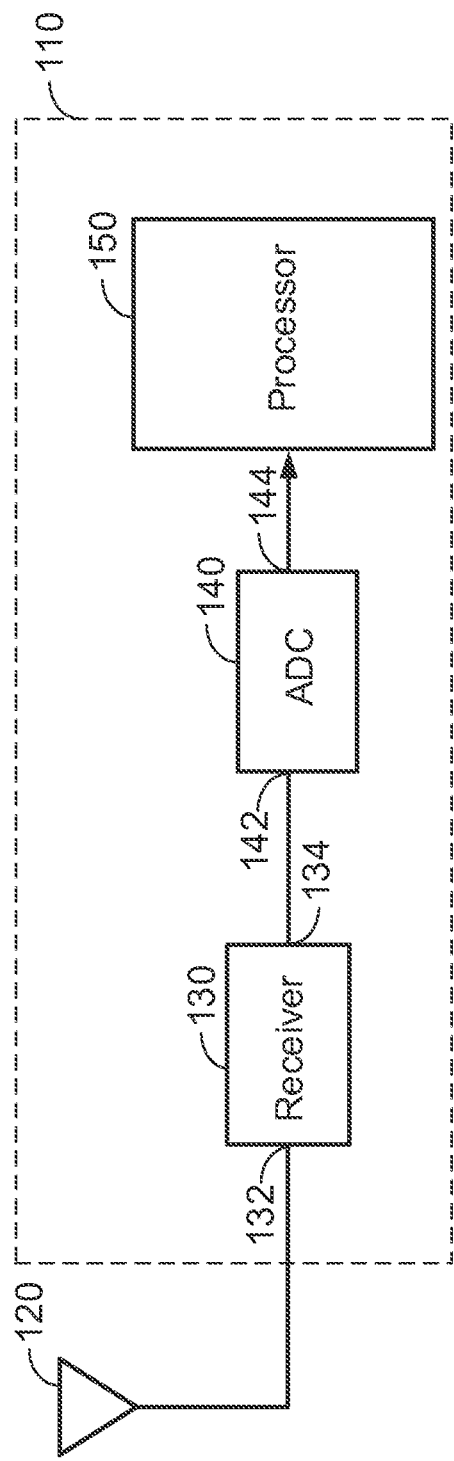
FIG. 1 shows an example of a system including an ADC according to certain aspects of the present disclosure.

An ADC may be used in a system to convert an analog signal into a digital signal. In this regard, FIG. 1 shows an example of a system 110 including an ADC 140 having an input 142 and an output 144 according to certain aspects. The ADC 140 is configured to convert an analog signal at the input 142 of the ADC 140 into a digital signal at the output 144 of the ADC 140. The system 110 also includes a receiver 130 and a processor 150. The receiver 130 has an input 132, and an output 134 coupled to the input 142 of the ADC 140. The processor 150 is coupled to the output 144 of the ADC 140.

In one example, the system 110 may be part of a wireless communication device (e.g., a handset). In this example, the input 132 of the receiver 130 may be coupled to one or more antennas 120, in which the receiver 130 is configured to receive a radio frequency (RF) signal at the input 132 via the one or more antennas 120. The RF signal may be transmitted from a base station, an access point, or another wireless communication device. The receiver 130 may be configured to process the received RF signal into an analog baseband signal, and to output the analog baseband signal to the ADC 140 for digital conversion. Processing performed by the receiver 130 may include frequency down-conversion, filtering, amplification, etc. The ADC 140 converts the analog baseband signal into a digital signal, and outputs the digital signal to the processor 150. The processor 150 may process the digital signal to recover data from the digital signal. Processing performed by the processor 150 may include demodulation, decoding, etc. The processor 150 may include a processor core, a digital signal processor (DSP), an application specific integrated circuit (ASIC), a field programmable gate array (FPGA) or another programmable logic device, or any combination thereof.

Figure 2:
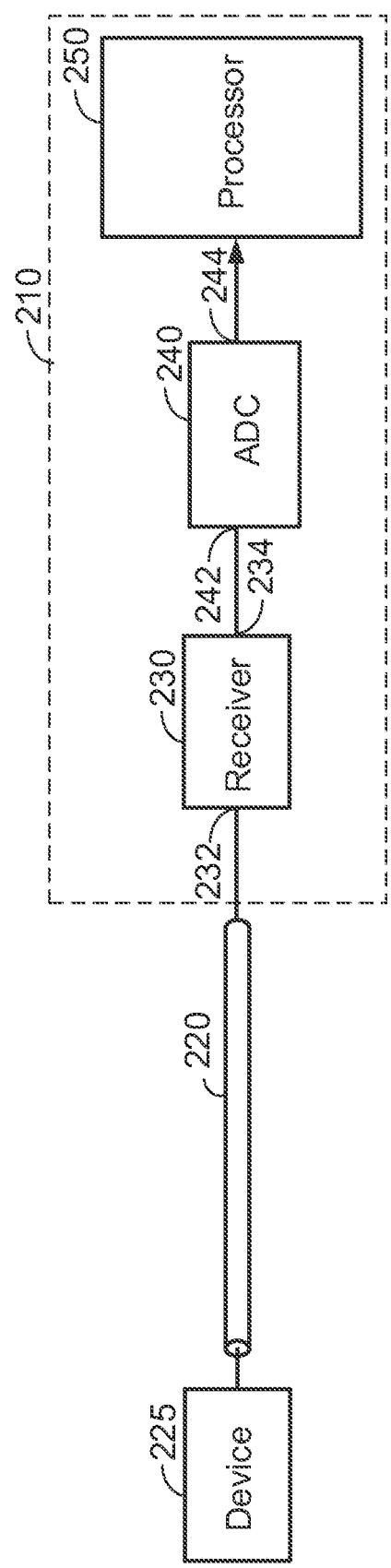
FIG. 2 shows another example of a system including an ADC according to certain aspects of the present disclosure.

FIG. 2 shows another example of a system 210 including an ADC 240 having an input 242 and an output 244 according to certain aspects. The ADC 240 is configured to convert an analog signal at the input 242 of the ADC 240 into a digital signal at the output 244 of the ADC 240. The system 210 also includes a receiver 230 and a processor 250. The receiver 230 has an input 232, and an output 234 coupled to the input 242 of the ADC 240. The processor 250 is coupled to the output 244 of the ADC 240.

In this example, the input 232 of the receiver 230 may be coupled to a wired channel 220 and configured to receive an analog signal via the wired channel 220. The wired channel 220 (also referred to as a wired link) may include one or more metal traces, one or more metal wires, a cable, or any combination thereof. In this example, the wired channel 220 is coupled between a device 225 and the input 232 of the receiver 230, in which a transmit driver (not shown) in the device 225 transmits the analog signal to the receiver 230 over the wired channel 220. The device 225 may include a peripheral device, an audio device, a sensor device (e.g., a temperature sensor, a medical sensor, etc.), or another type of device.

In this example, the receiver 230 may process the analog signal from the wired channel 220 into a processed analog signal and output the processed analog signal to the ADC 240 for digital conversion. Processing performed by the receiver 230 may include amplification, equalization, etc. The ADC 240 converts the processed analog signal into a digital signal, and outputs the digital signal to the processor 250 for processing. The processor 250 may include a processor core, an audio codec, a digital signal processor (DSP), an application specific integrated circuit (ASIC), a field programmable gate array (FPGA) or another programmable logic device, or any combination thereof.

The ADC 140 in FIG. 1 and the ADC 240 in FIG. 2 may each be implemented with a successive approximation ADC (also referred to as a successive approximation register (SAR) ADC). A successive approximation ADC may include a comparator, a digital-to-analog converter (DAC), and a successive approximation register (SAR). The SAR outputs a digital signal (also referred to as a digital code) to the DAC, which converts the digital signal into an output voltage. The comparator compares the output voltage of the DAC with an analog input voltage, and outputs a compare signal based on the comparison to the SAR. The SAR successively resolves the bits of the digital signal based on the compare signal, in which the resolved bits of the digital signal provide a digital value that is a digital representation of the analog input voltage. Various implementations of the SAR (e.g., employing flip-flops and/or combinational logic) are well known in the art. The SAR may also be referred to as SAR logic.

Figure 3:
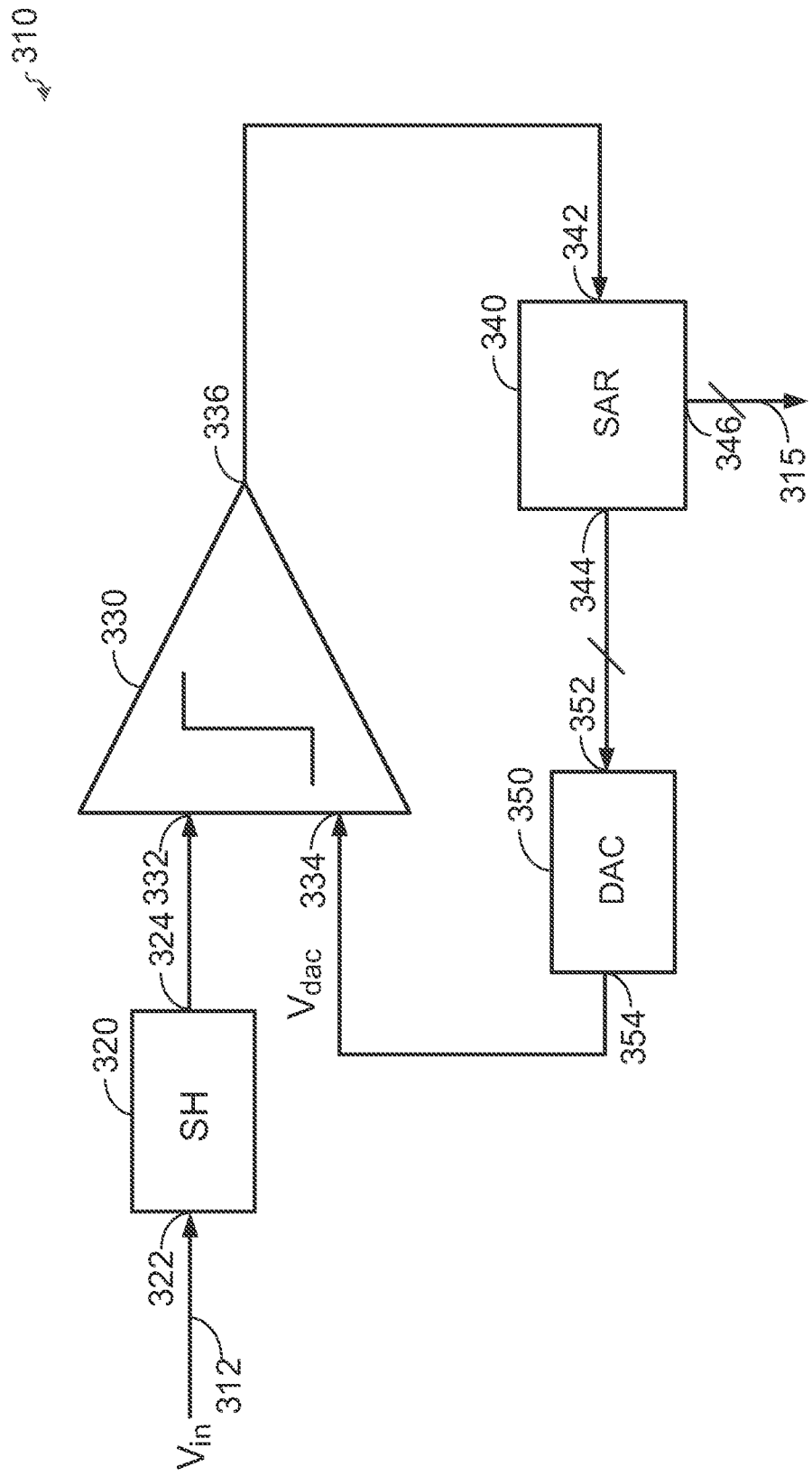
FIG. 3 shows an example of a successive approximation ADC according to certain aspects of the present disclosure.

FIG. 3 shows a simplified block diagram of an example of a successive approximation ADC 310. The ADC 310 is configured to receive an analog input voltage (labeled "$V_{in}$") at an analog input 312, to convert the analog input voltage $V_{in}$ into a digital value, and to output the digital value at a digital output 315. The digital value provides a digital representation of the analog input voltage $V_{in}$.

The ADC 310 includes a sample and hold circuit 320, a comparator 330, a SAR 340, and a DAC 350. The sample and hold circuit 320 has an input 322 coupled to the analog input 312 of the ADC 310, and an output 324. The comparator 330 has a first input 332 coupled to the output 324 of the sample and hold circuit 320, a second input 334, and an output 336. The SAR 340 has an input 342 coupled to the output 336 of the comparator 330, a first output 344, and a second output 346 coupled to the digital output 315 of the ADC 310. The DAC 350 has an input 352 coupled to the first output 344 of the SAR 340, and an output 354 coupled to the second input 334 of the comparator 330.

The sample and hold circuit 320 is configured to receive the analog input voltage $V_{in}$ at the input 322, to sample the analog input voltage $V_{in}$, and to hold the sampled analog input voltage $V_{in}$ at the output 324. The DAC 350 is configured to receive an N-bit digital signal from the SAR 340 at the input 352, to convert the digital signal into a DAC voltage (labeled "$V_{DAC}$"), and to output the DAC voltage $V_{DAC}$ at the output 354.

The comparator 330 is configured to receive the sampled analog input voltage $V_{in}$ at the first input 332 and the DAC voltage $V_{DAC}$ at the second input 334, to compare the sampled analog input voltage $V_{in}$ with the DAC voltage $V_{DAC}$, and to output a compare signal at the output 336 based on the comparison. In certain aspects, the logic value (i.e., logic state) of the compare signal indicates whether the sampled analog input voltage $V_{in}$ is greater than or less than the DAC voltage $V_{DAC}$. The SAR 340 is configured to use the compare signal from the comparator 330 and the DAC 350 to convert the sampled analog input voltage $V_{in}$ into a digital value at the digital output 315, as discussed further below.

The ADC 310 converts the analog input voltage $V_{in}$ into a digital value at the digital output 315 in an analog-to-digital conversion operation that includes a sampling phase and a conversion phase (also referred as a SAR phase). During the sampling phase, the sample and hold circuit 320 is configured to sample the analog input voltage $V_{in}$. During the conversion phase, the sample and hold circuit 320 is configured to output the sampled analog input voltage $V_{in}$ to the first input 332 of the comparator 330.

During the conversion phase, the SAR 340 converts the sampled analog input voltage $V_{in}$ into a digital value using the compare signal from the comparator 330 and the DAC 350. To do this, the SAR 340 outputs an N-bit digital signal to the DAC 350 via the first output 344, and successively resolves the N bits of the digital signal based on the compare signal from the comparator 330 using a binary search or another search algorithm. The SAR 340 starts the binary search with the most significant bit (MSB) of the digital signal (also referred to as a digital code). To resolve the MSB, the SAR 340 may set the MSB to one and the remaining bits of the digital signal to zero. The SAR 340 may then resolve the MSB based on the compare signal from the comparator 330. For example, if the compare signal indicates that the DAC voltage $V_{DAC}$ is less than the sampled analog input voltage $V_{in}$, then the SAR 340 may resolve the MSB to a bit value of one, and, if the compare signal indicates that the DAC voltage $V_{DAC}$ is greater than the sampled analog input voltage $V_{in}$, then the SAR 340 may resolve the MSB to a bit value of zero.

After resolving the MSB, the SAR 340 repeats the above process for each of the remaining bits of the digital signal to resolve the remaining bits of the digital signal. After all N bits of the digital signal have been resolved, the SAR 340 outputs the resolved bits at the digital output 315 of the ADC 310 via the second output 346. The resolved bits of the digital signal provide a digital value that is a digital representation of the sampled analog input voltage $V_{in}$.

Figure 4:
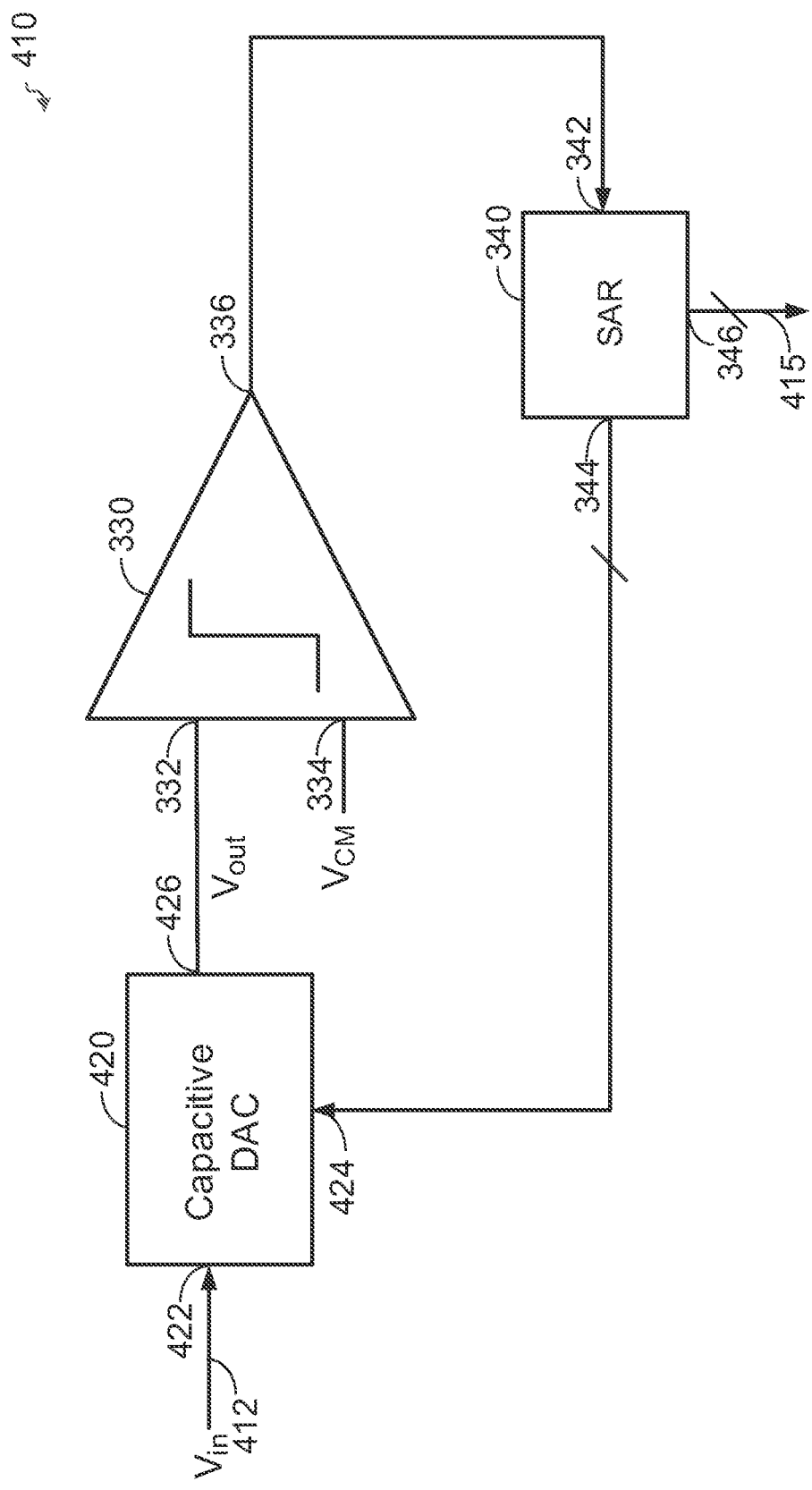
FIG. 4 shows an example of an ADC including a capacitive digital-to-analog converter (DAC) according to certain aspects of the present disclosure.

In certain aspects, the DAC 350 may be implemented with a capacitive DAC. In these aspects, the sample and hold function may be integrated into the capacitive DAC, eliminating the need for a separate sample and hold circuit (e.g., the sample and hold circuit 320). In this regard, FIG. 4 shows an example of a successive approximation ADC 410 including a capacitive DAC 420. The capacitive DAC 420 may be implemented using any one of a variety of capacitive DACs known in the art. An exemplary implementation of the capacitive DAC 420 is discussed further below with reference to FIG. 5. As discussed further below, the capacitive DAC 420 is configured to convert the digital signal from the SAR 340 into one of a finite number of voltages based on the bit values of the digital signal (also referred to as the digital code).

The ADC 410 also includes the comparator 330 and the SAR 340 discussed above. The ADC 410 is configured to receive an analog input voltage (labeled "$V_{in}$") at an analog input 412, to convert the analog input voltage $V_{in}$ into a digital value, and to output the digital value at a digital output 415.

In this example, the capacitive DAC 420 has a first input 422, a second input 424, and an output 426. The first input 422 is coupled to the analog input 412 of the ADC 410, and the second input 424 is coupled to the first output 344 of the SAR. The output 426 of the capacitive DAC 420 is coupled to the first input 332 of the comparator 330. The second input 334 of the comparator 330 is coupled to a common mode voltage $V_{CM}$.

The ADC 410 is configured to convert the analog input voltage $V_{in}$ into a digital value at the digital output 415 in an analog-to-digital conversion operation that includes a sampling phase and a conversion phase. During the sampling phase, the capacitive DAC 420 is configured to sample the analog input voltage $V_{in}$. During the conversion phase, the capacitive DAC 420 is configured to convert the digital signal from the SAR 340 into a DAC voltage $V_{DAC}$.

The capacitive DAC 420 outputs an output voltage (labeled "$V_{out}$") at the output 426. In one example, the output voltage $V_{out}$ includes a voltage equal to a difference between the sampled analog input voltage $V_{in}$ and the DAC voltage $V_{DAC}$. The output voltage $V_{out}$ may also include the common mode voltage $V_{CM}$, as discussed further below. In this example, the comparator 330 compares the output voltage $V_{out}$ of the capacitive DAC 420 with the common mode voltage $V_{CM}$, and outputs a compare signal to the SAR 340 based on the comparison.

During the conversion phase, the SAR 340 successively resolves the N bits of the digital signal based on the compare signal from the comparator 330 starting with the MSB using a binary search or another search algorithm. After all N bits of the digital signal have been resolved, the SAR 340 outputs the resolved bits at the digital output 415 of the ADC 410 via the second output 346. The resolved bits of the digital signal provide a digital value that is a digital representation of the sampled analog input voltage $V_{in}$.

Figure 5:
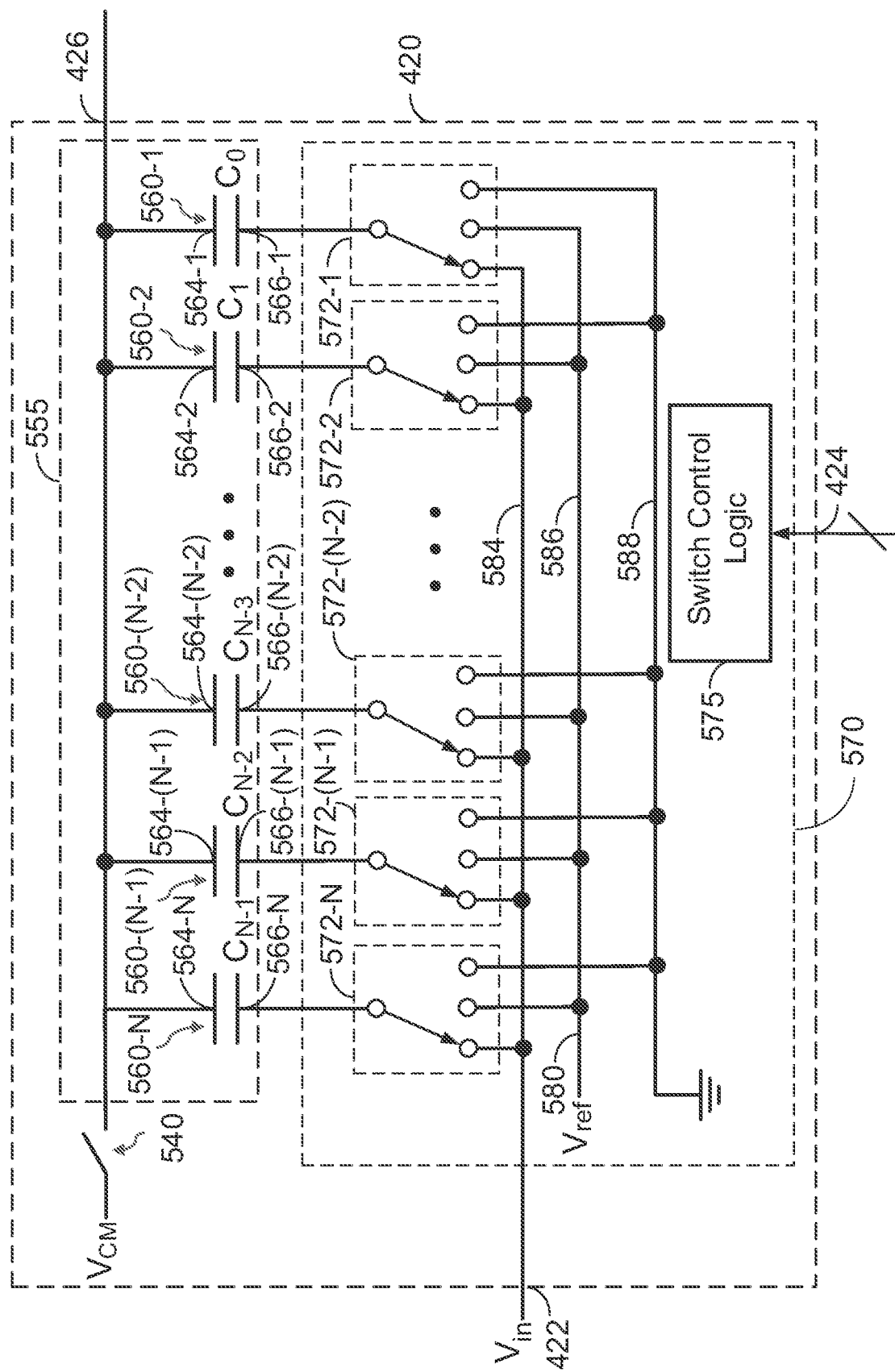
FIG. 5 shows an exemplary implementation of a capacitive DAC according to certain aspects of the present disclosure.

FIG. 5 shows an exemplary implementation of the capacitive DAC 420 according to certain aspects. In this example, the capacitive DAC 420 includes a capacitor array 555, a switching circuit 570, and a switch 540. The capacitor array 555 includes a set of capacitors 560-1 to 560-N, in which each of the capacitors 560-1 to 560-N corresponds to a respective one of the bits of the digital signal from the SAR 340. More particularly, capacitor 560-N corresponds to the MSB and capacitor 560-1 corresponds to the least significant bit (LSB) of the digital signal. Each of the capacitors 560-1 to 560-N has a respective first terminal 564-1 to 564-N coupled to the output 426 of the capacitive DAC 420.

In certain aspects, the capacitors 560-1 to 560-N have binary-weighted capacitances, in which the capacitor 560-N corresponding to the MSB has the largest capacitance and the capacitor 560-1 corresponding to the LSB has the smallest capacitance. In this example, the capacitance of the capacitor 560-1 corresponding to the LSB may be equal to a unit capacitance. The capacitances of the other capacitors 560-2 to 560-N may be given by:

$$C_k = C_u \cdot 2^k \quad (1)$$

where $C_u$ is the unit capacitance, and k is a capacitance index having a value from k=0 to k=N−1. In equation (1), k=0 corresponds to the capacitance of capacitor 560-1 and k=N−1 corresponds to the capacitance of capacitor 560-N. Thus, capacitance $C_0$ is capacitance of the capacitor 560-1 corresponding to the LSB and capacitance $C_{N-1}$ is capacitance of the capacitor 560-N corresponding to the MSB. In this example, each of the capacitors 560-N to 560-2 shown in FIG. 5 has a capacitance approximately equal to twice the capacitance of the capacitor to the immediate right. For example, capacitor 560-N has twice the capacitance of capacitor 560-(N−1), capacitor 560-(N−1) has twice the capacitance of capacitor 560-(N−2), and so forth.

The switch 540 is coupled between the capacitor array 555 and the common mode voltage $W_{CM}$. In the example in FIG. 5, the switch 540 is coupled between the first terminals 564-1 to 564-N of the capacitors 560-1 to 560-N and the common mode voltage $W_{CM}$. Because the first terminals 564-1 to 564-N of the capacitors 560-1 to 560-N are coupled to the output 426 of the capacitive DAC 420 in this example, the switch 540 is coupled between the output 426 and the common mode voltage $W_{CM}$.

The switching circuit 570 includes switches 572-1 to 572-N, in which each of the switches 572-1 to 572-N is coupled to a respective one of the capacitors 560-1 to 560-N in the capacitor array 555. Each of the switches 572-1 to 572-N is configured to selectively couple a second terminal 566-1 to 566-N of the respective capacitor 560-1 to 560-N to an input line 584, a reference line 586, or a ground line 588, as discussed further below. The input line 584 is coupled to the first input 422 of the capacitive DAC 420 to receive the analog input voltage $V_{in}$. The reference line 586 is coupled to a reference voltage $V_{ref}$ and the ground line 588 is coupled to ground.

The switching circuit 570 also includes switch control logic 575 configured to receive the digital signal from the SAR 340, and to control the switches 572-1 to 572-N based on the bit values of the digital signal during the conversion phase. For ease of illustration, the individual connections between the switches 572-1 to 572-N and the switch control logic 575 are not shown in FIG. 5. In one example, if a bit of the digital signal is one, then the switch control logic 575 causes the respective switch 572-1 to 572-N to couple the second terminal 566-1 to 566-N of the respective capacitor 560-1 to 560-N to the reference line 586. If a bit of the digital signal is zero, then the switch control logic 575 causes the respective switch 572-1 to 572-N to couple the second terminal 566-1 to 566-N of the respective capacitor 560-1 to 560-N to the ground line 588.

In this example, during the sampling phase, the switch 540 is turned on (i.e., closed) to couple the first terminals 564-1 to 564-N of the capacitors 560-1 to 560-N to the common mode voltage $V_{CM}$. To sample the analog input voltage $V_{in}$, the switch control logic 575 causes each of the switches 572-1 to 572-N to couple the second terminal 566-1 to 566-N of the respective capacitor 560-1 to 560-N to the input line 584, which receives the analog input voltage $V_{in}$. Note that FIG. 5 shows the positions of the switches 572-1 to 572-N during the sampling phase.

During the conversion phase, the switch 540 is turned off (i.e., open) to decouple the first terminals 564-1 to 564-N of the capacitors 560-1 to 560-N from the common mode voltage $V_{CM}$. Also, during the conversion phase, the capacitive DAC 420 outputs an output voltage at the output 426 based the digital signal from the SAR 340. The output voltage may be given by:

$$V_{out} = (V_{CM} - V_{in}) + V_{ref} \cdot \sum_{k=0}^{N-1} B_k \cdot 2^{(k-N)} \quad (2)$$

where $V_{out}$ is the output voltage of the capacitive DAC 420, $V_{in}$ is the sampled analog input voltage $V_{in}$, $V_{CM}$ is the common mode voltage, $V_{ref}$ is the reference voltage, Bk is a bit of the digital signal, and k is a bit index. In this example, $B_{N-1}$ is the MSB of the digital signal and $B_0$ is the LSB of the digital signal.

During the conversion phase, the SAR 340 outputs the digital signal to the capacitive DAC 420, and successively resolves the N bits of the digital signal based on the compare signal from the comparator 330. In certain aspect, the SAR 340 successively resolves the N bits of the digital signal using a binary search, in which the SAR 340 starts with the MSB of the digital signal.

To resolve the MSB of the digital signal, the SAR 440 sets the MSB (i.e., $B_{N-1}$) to one and sets each of the remaining bits (i.e., $B_{N-2}$ to $B_0$) of the digital signal to zero. The SAR 340 then resolves the MSB based on the compare signal from the comparator 330. If the compare signal indicates that $V_{out}$ is greater than $V_{CM}$ (i.e., $V_{out}$ minus $V_{CM}$ is greater than zero), then the SAR 340 resolves the MSB to a bit value of zero. If the compare signal indicates that $V_{out}$ is less than $V_{CM}$ (i.e., $V_{out}$ minus $V_{CM}$ is less than zero), then the SAR 340 resolves the MSB to a bit value of one.

After resolving the MSB (i.e., $B_{N-1}$), the SAR 340 resolves the second most significant bit (i.e., $B_{N-2}$). To do this, the SAR 340 sets the MSB to its resolved bit value, sets the second most significant bit (i.e., $B_{N-2}$) to one, and sets the remaining bits (i.e., $B_{N-3}$ to $B_0$) to zero. The SAR 340 then resolves the second most significant bit based on the compare signal from the comparator 330. If the compare signal indicates that $V_{out}$ is greater than $V_{CM}$ (i.e., $V_{out}$ minus $V_{CM}$ is greater than zero), then the SAR 340 resolves the second most significant bit to a bit value of zero. If the compare signal indicates that $V_{out}$ is less than $V_{CM}$ (i.e., $V_{out}$ minus $V_{CM}$ is less than zero), then the SAR 340 resolves the second most significant bit to a bit value of one.

The SAR 340 repeats the above process for each of the remaining bits (i.e., $B_{N-3}$ to $B_0$) of the digital signal to resolve the remaining bits of the digital signal. After all N bits (i.e., $B_{N-1}$ to $B_0$) of the digital signal have been resolved, the SAR 340 outputs the resolved bits at the digital output 415 of the ADC 410, in which the resolved bits of the digital signal provide a digital value that is digital representation of the sampled analog input voltage $V_{in}$.

It is to be appreciated that the capacitive DAC 420 is not limited to the exemplary implementation shown in FIG. 5. In general, the capacitive DAC 420 may include a switching circuit and binary-weighted capacitors, where each of the binary-weighted capacitors has a respective first terminal and a respective second terminal. The first terminals of the capacitors may be coupled to the output 426 of the capacitive DAC 425. During the conversion phase, the switching circuit controls switching of the second terminals of the binary-weighted capacitors between two or more voltages based on the digital signal from the SAR 340. In one example, the two or more voltages includes a reference voltage and ground. In another example, the two or more voltages includes a positive reference voltage and a negative reference voltage. In some implementations, the capacitor array 550 may be implemented with a slip-capacitor array, or another type of capacitor array. The capacitor array 550 may also be non-binary weighted in some implementations. Thus, it is to be appreciated that the capacitive DAC 420 is not limited to a particular implementation.

In some implementations, the common mode voltage $V_{CM}$ may be approximately zero. In these implementations, the second input 334 of the comparator 330 may be coupled to ground, and the switch 540 in the capacitive DAC 420 may be coupled between the first terminals 564-1 to 564-N of the capacitors 560-1 to 560-N and ground.

The ADC 410 may periodically perform the analog-to-digital conversion operation discussed above to track changes in the input analog voltage $V_{in}$. For example, the ADC 410 may sequentially perform multiple analog-to-digital conversion operations over multiple ADC cycles, in which one of the analog-to-digital conversion operations is performed in each of the ADC cycles.

The ADC 410 suffers from quantization noise at the digital output 415. This is because the ADC 410 quantizes the analog input voltage $V_{in}$ into a digital value having one of a finite number of values. At the end of each ADC cycle, the quantization results in a residue voltage $V_{res}$ at the output 426 of the capacitive DAC 420, in which the residue voltage $V_{res}$ is equal to the difference between the sampled analog input voltage $V_{in}$ and the voltage corresponding to the resolved bits of the digital signal at the end of the conversation phase.

An ADC may employ noise shaping to reduce the quantization noise. For example, noise shaping may be achieved by adding the residue voltage from a previous ADC cycle to the sampled input analog voltage $V_{in}$ in the current ADC cycle. This results in noise shaping given in the z-domain by the following:

$$Y = X + (1 - z^{-1})Q \quad (3)$$

where Y corresponds to the output of the ADC, X corresponds to the input of the ADC, and Q corresponds to the quantization noise.

Figure 6:
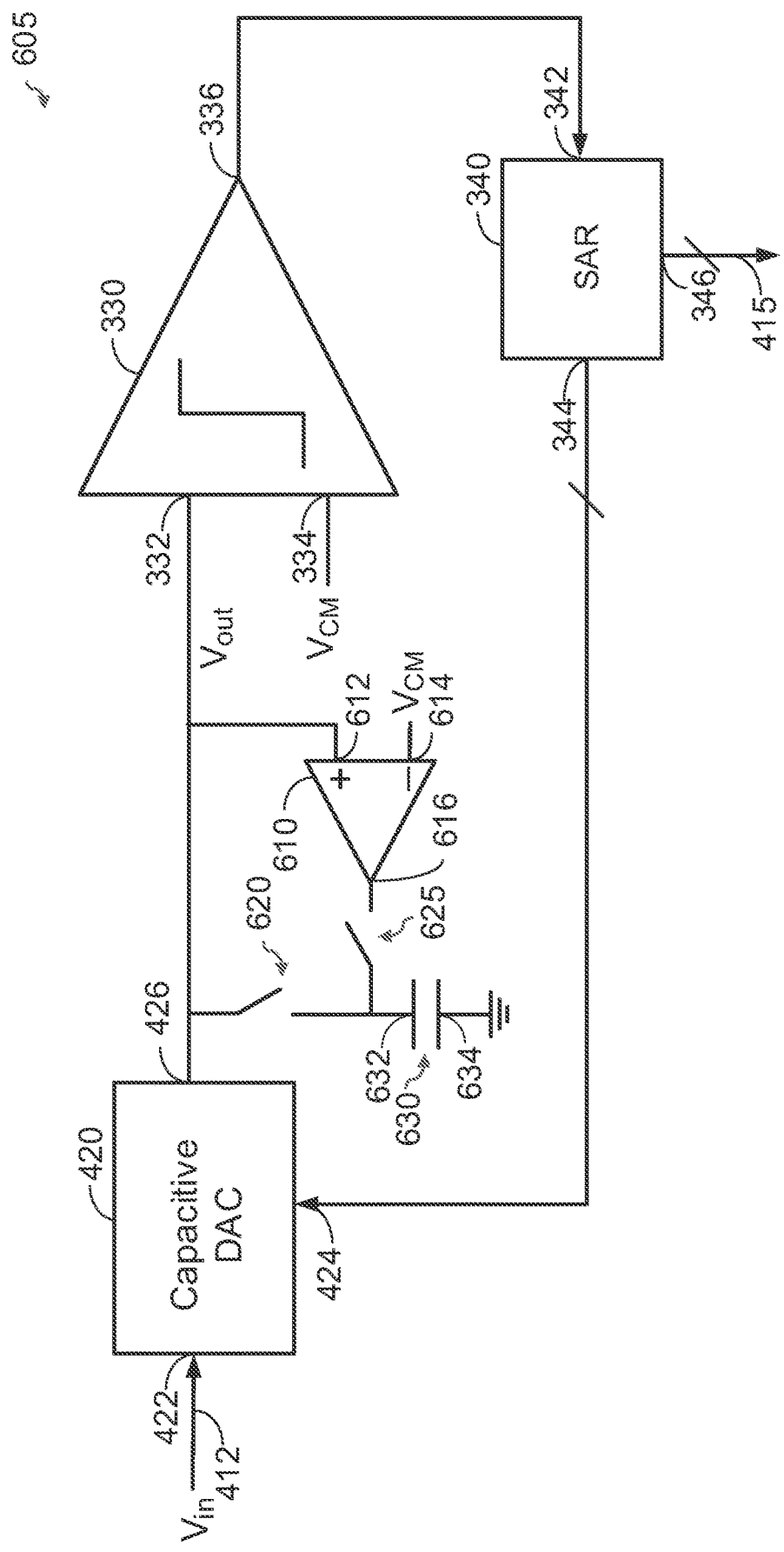
FIG. 6 shows an example of an ADC with noise shaping using charge sharing according to certain aspects of the present disclosure.

FIG. 6 shows an example of an ADC 605 employing one approach for noise shaping based on equation (3). In this example, the ADC 605 includes the capacitive DAC 420, the comparator 330, and the SAR 340 discussed above. For noise shaping, the ADC 605 also includes an amplifier 610, a holding capacitor 630, a first switch 620, and a second switch 625. The amplifier 610 has a first input 612 coupled to the output 426 of the capacitive DAC 420, a second input 614 coupled to the common mode voltage $V_{CM}$, and an output 616. The first switch 620 is coupled between the output 426 of the capacitive DAC and a first terminal 632 of the holding capacitor 630, and the second switch 625 is coupled between the first terminal 632 of the holding capacitor 630 and the output 616 of the amplifier 610. A second terminal 634 of the holding capacitor 630 is coupled to ground.

During the conversion phase of an ADC cycle, the second switch 625 is turned on (i.e., closed) and the first switch 620 is turned off (i.e., open). As a result, the holding capacitor 630 is coupled to the output 616 of the amplifier 610. At the end of the conversion phase, the amplifier 610 transfers the residue voltage $V_{res}$ from the first input 612 of the amplifier 610 (which is coupled to the output 426 of the capacitive DAC 420) to the holding capacitor 630 by sensing the residue voltage $V_{res}$ at the first input 612 and charging the holding capacitor 630 based on the sensed residue voltage $V_{res}$. In certain aspects, the output 616 of the amplifier 610 may also include the common mode voltage $V_{CM}$ and therefore charge the holding capacitor 630 to a voltage that includes the residue voltage $V_{res}$ and the common mode voltage $V_{CM}$. Since the holding capacitor 630 provides the common mode voltage $V_{CM}$ in these aspects, the switch 540 shown in FIG. 5 is open during the sampling phase or omitted in these aspects.

During the sampling phase of the next ADC cycle, the second switch 625 is turned off (i.e., open) and the first switch 620 is turned on (i.e., closed). As a result, the holding capacitor 630 is coupled to the output 426 of the capacitive DAC 420. This couples the holding capacitor 630 to the first terminals 564-1 to 564-N of the capacitors 560-1 to 560-N in the capacitive DAC 420, which causes a portion of the residue voltage $V_{res}$ to be added to the sampled input analog voltage $V_{in}$ in the next ADC cycle through charge sharing. The amount of the residue voltage $V_{res}$ added to the sampled input analog voltage $V_{in}$ is given by:

$$V_{CS} = V_{res} \cdot \frac{c_1}{c_1 + c_2} \quad (4)$$

where $V_{CS}$ is the amount of the residue voltage $V_{res}$ added to the sampled input analog voltage $V_{in}$ through charge sharing, $C_1$ is the capacitance of the holding capacitor 630, and $C_2$ is the total capacitance of the capacitors 560-1 to 560-N in the capacitive DAC 420. The amount of the residue voltage $V_{res}$ transferred to the capacitive DAC 420 may be given by:

$$V_{rt} = \alpha \cdot V_{res} \quad (5)$$

where $V_{rt}$ is the amount of the residue voltage $V_{res}$ transferred to the capacitive DAC 420 and a is less than one (e.g., due to charge sharing). Ideally, $\alpha$ is equal to one to fully implement noise shaping based on equation (3). In the example in FIG. 6, $\alpha$ is approximately equal to $C_1/(C_1+C_2)$. Thus, the charge sharing reduces the residue voltage $V_{res}$ based on the capacitor ratio $C_1/(C_1+C_2)$.

Figure 7:
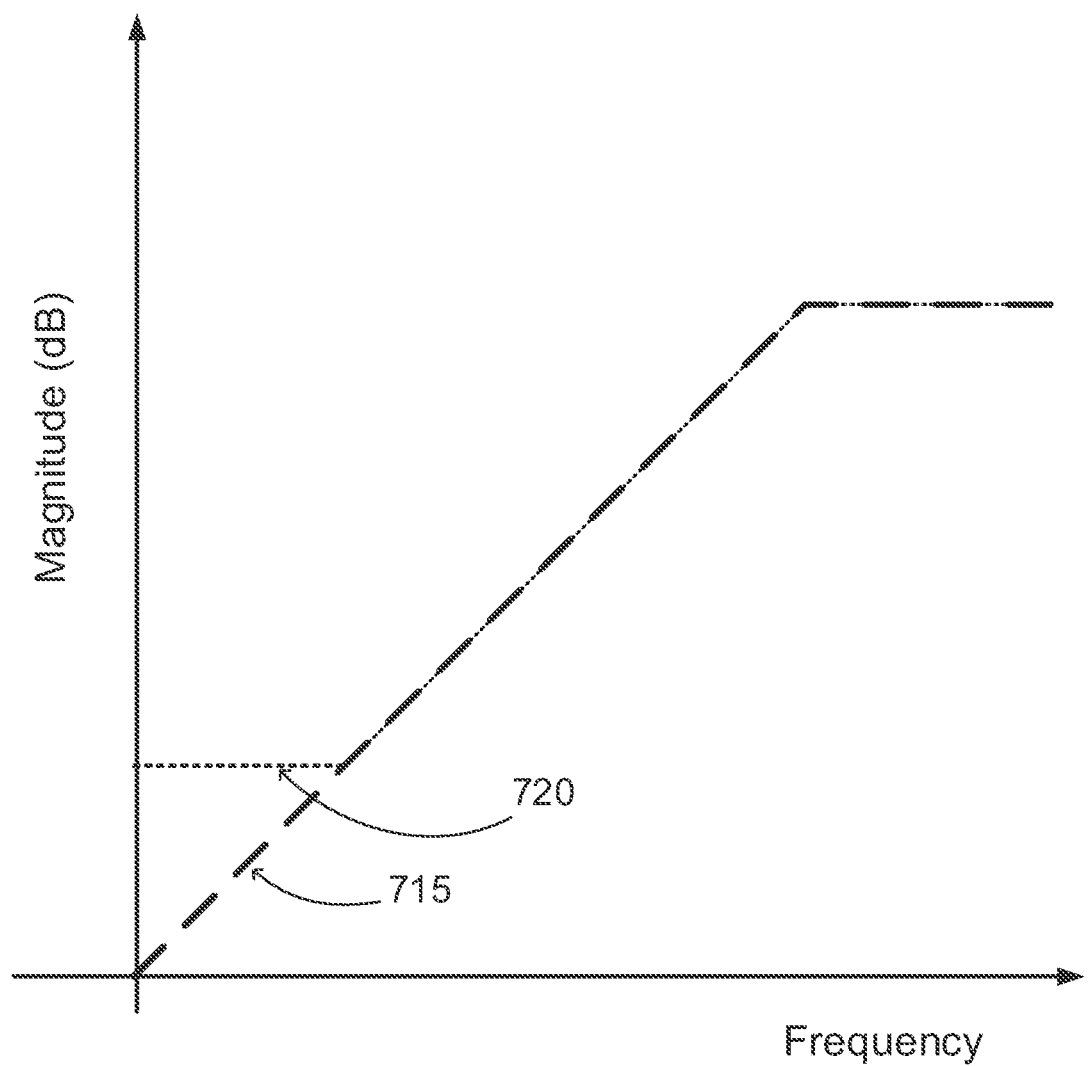
FIG. 7 is a plot illustrating an example of noise shaping degradation due to charge sharing according to certain aspects of the present disclosure.

The noise shaping degrades as $\alpha$ becomes lower, an example of which is illustrated in FIG. 7. FIG. 7 shows an example of the quantization noise spectrum 715 for the ideal case where $\alpha$ is equal to one, and an example of the quantization noise spectrum 720 for a case where a is less than one. As shown in FIG. 7, the magnitude of the quantization noise is higher at lower frequencies when $\alpha$ is less than one compared with the ideal case. Thus, it is desirable to keep a close to one to reduce the noise shaping degradation. Because $\alpha$ is equal the capacitor ratio $C_1/(C_1+C_2)$ in FIG. 6, this requires making the holding capacitor 630 much larger than the capacitors in the capacitive DAC 420 (e.g., ten times larger) to achieve a capacitor ratio $C_1/(C_1+C_2)$ close to one. The large size of the holding capacitor 630 significantly increases the area of the ADC 605.

Figure 8:
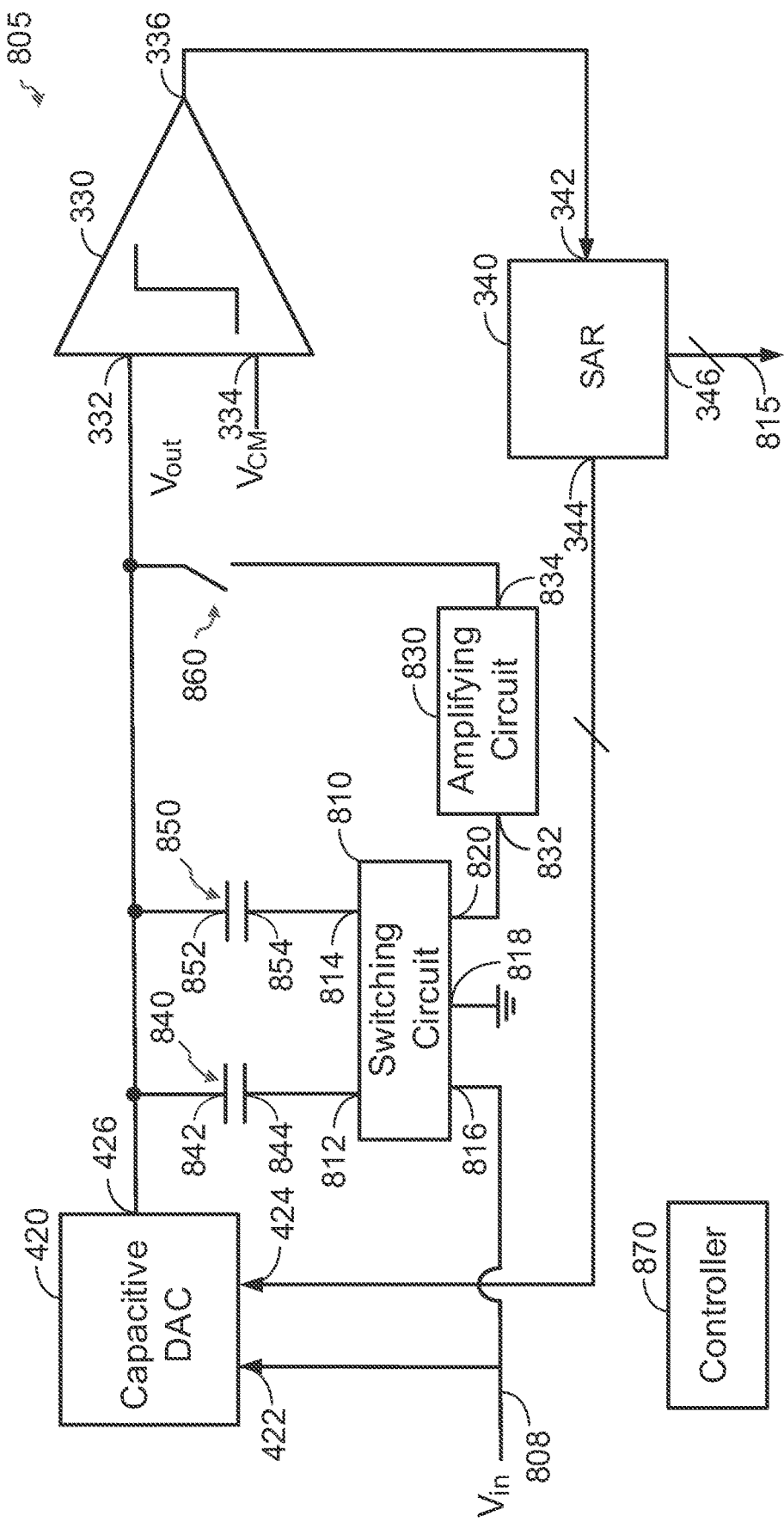
FIG. 8 shows an example of an ADC including a first capacitor and a second capacitor with noise shaping according to certain aspects of the present disclosure.

FIG. 8 shows an example of a successive approximation ADC 805 with noise shaping according to certain aspects of the present disclosure. The ADC 805 is configured to receive an analog input voltage (labeled "$V_{in}$") at an input 808, to convert the analog input voltage $V_{in}$ into a digital value, and to output the digital value at an output 815. The ADC 805 may be used to implement the ADC 140 in FIG. 1, in which the input 808 of the ADC 805 is coupled to the output 134 of the receiver 130, and the output 815 of the ADC 805 is coupled to the processor 150. The ADC 805 may also be used to implement the ADC 240 in FIG. 2, in which the input 808 of the ADC 805 is coupled to the output 234 of the receiver 230, and the output 815 of the ADC 805 is coupled to the processor 250.

The ADC 805 includes the capacitive DAC 420, the comparator 330, and the SAR 340 discussed above. For noise shaping, the ADC 805 also includes a first capacitor 840, a second capacitor 850, a switching circuit 810, an amplifying circuit 830, and a switch 860.

The switching circuit 810 has a first terminal 812, a second terminal 814, a third terminal 816, a fourth terminal 818, and a fifth terminal 820. The first capacitor 840 is coupled between the output 426 of the capacitive DAC 420 and the switching circuit 810. In the example in FIG. 8, the first capacitor 840 has a first terminal 842 coupled to the output 426 of the capacitive DAC 420, and a second terminal 844 coupled to the first terminal 812 of the switching circuit 810. The second capacitor 850 is coupled between the output 426 of the capacitive DAC 420 and the switching circuit 810. In the example in FIG. 8, the second capacitor 850 has a first terminal 852 coupled to the output 426 of the capacitive DAC 420, and a second terminal 854 coupled to the second terminal 814 of the switching circuit 810. The third terminal 816 of the switching circuit 810 is coupled to the input 808 of the ADC 805 to receive the input analog voltage $V_{in}$, and the fourth terminal 818 of the switching circuit 810 is coupled to ground.

The amplifying circuit 830 has an input 832 and an output 834. The input 832 of the amplifying circuit 830 is coupled to the fifth terminal 820 of the switching circuit 810. The switch 860 is coupled between the output 834 of the amplifying circuit 830 and the output 426 of the capacitive DAC 420. The amplifying circuit 830 may be implemented with one or more amplifiers, as discussed further below.

The switching circuit 810 is configured to selectively couple the second terminal 844 of the first capacitor 840 to one of the input 808 of the ADC 805, the ground, and the input 832 of the amplifying circuit 830. The switching circuit 810 is also configured to selectively couple the second terminal 854 of the second capacitor 850 to one of the input 808 of the ADC 805, the ground, and the input 832 of the amplifying circuit 830. The switching circuit 810 may be implemented with multiple switches, as discussed further below.

In certain aspects, switching of the switching circuit 810 and switching of the switch 860 are controlled by a controller 870, as discussed further below. For ease of illustration, the individual connections between the controller 870 and the switching circuit 810, and between the controller 870 and the switch 860 are not shown in FIG. 8.

Figure 9A:
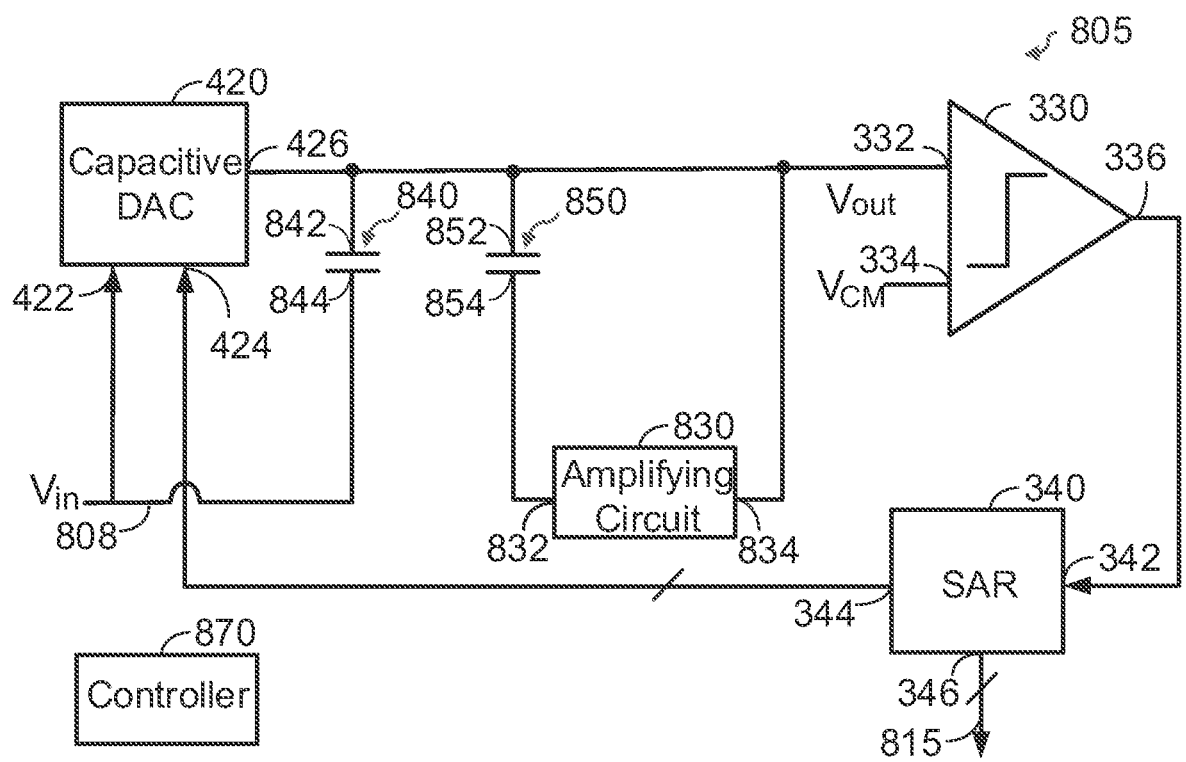
FIG. 9A shows an example of an equivalent circuit of the ADC in FIG. 8 during a sampling phase of a $k^{th}$ ADC cycle according to certain aspects of the present disclosure.
Figure 9B:
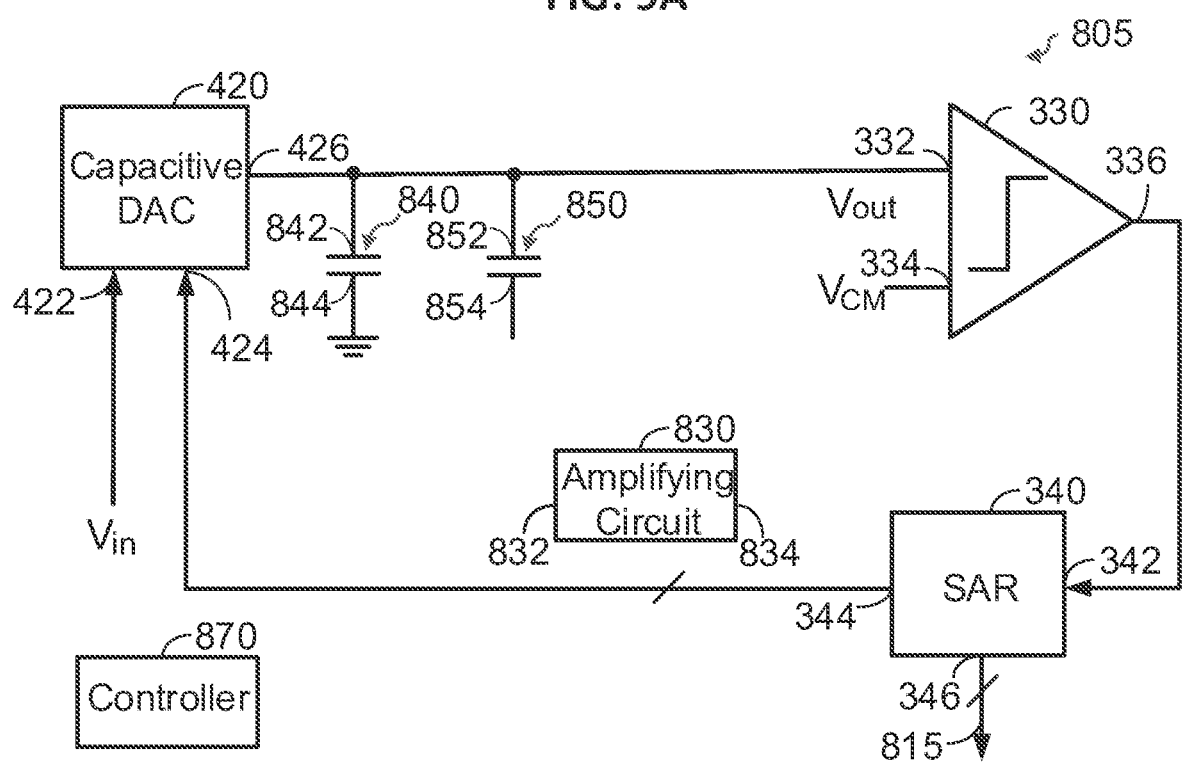
FIG. 9B shows an example of an equivalent circuit of the ADC in FIG. 8 during a conversion phase of the $k^{th}$ ADC cycle according to certain aspects of the present disclosure.
Figure 9C:
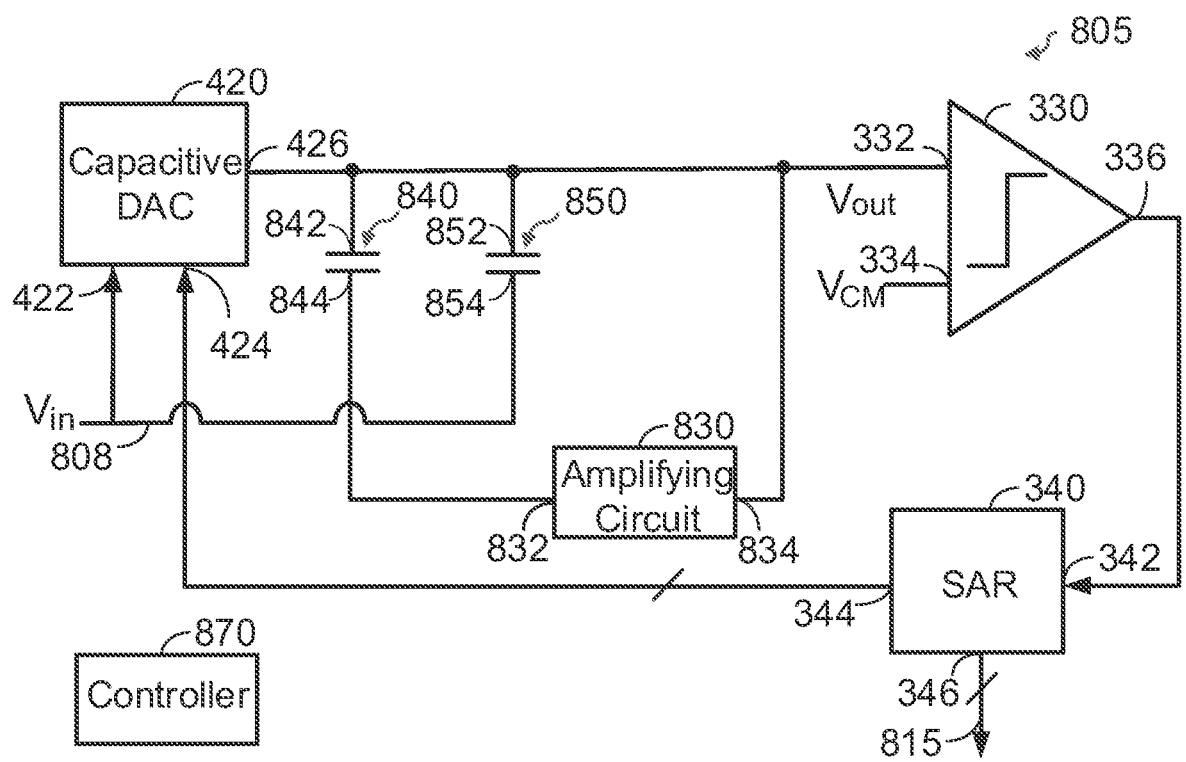
FIG. 9C shows an example of an equivalent circuit of the ADC in FIG. 8 during a sampling phase of a $(k+1)^{th}$ ADC cycle according to certain aspects of the present disclosure.
Figure 9D:
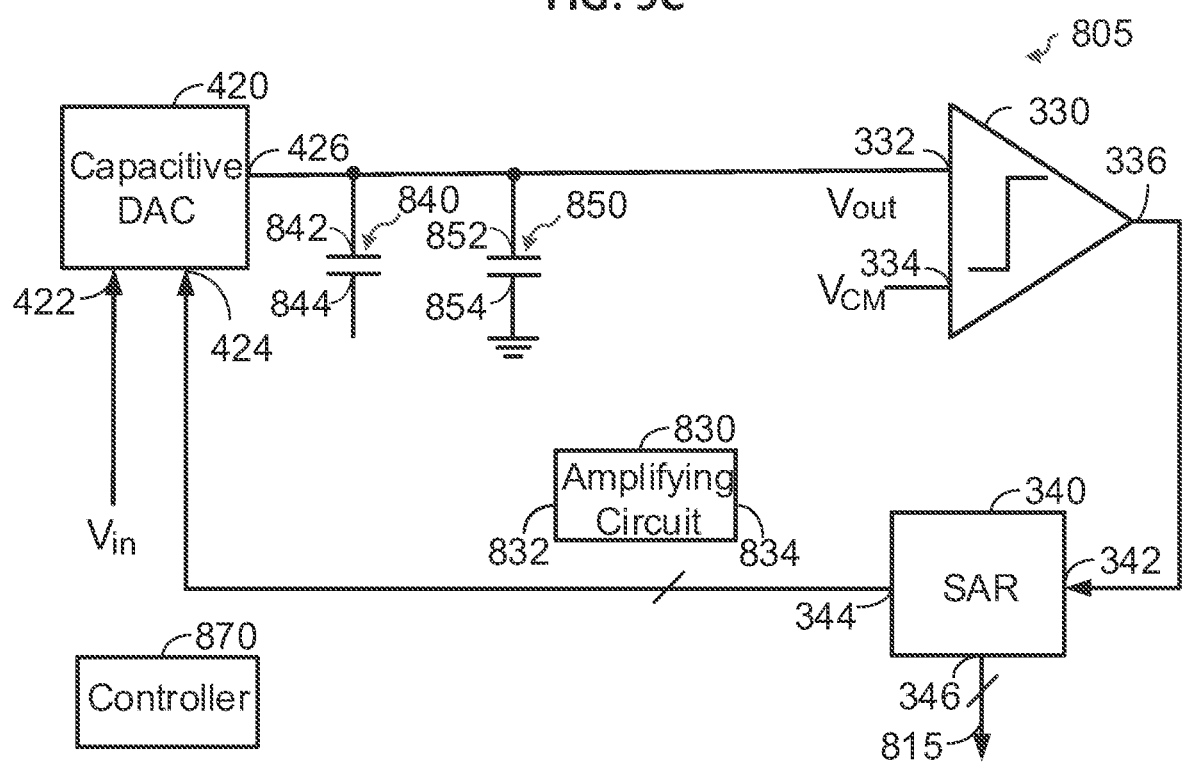
FIG. 9D shows an example of an equivalent circuit of the ADC in FIG. 8 during a conversion phase of the $(k+1)^{th}$ ADC cycle according to certain aspects of the present disclosure.

Exemplary operations of the ADC 805 will now be discussed with reference to FIGS. 9A to 9D according to certain aspects. FIGS. 9A and 9B show examples of equivalent circuits of the ADC 805 during the sampling phase and the conversion phase, respectively, of a $k^{th}$ ADC cycle. FIGS. 9C and 9D show examples of equivalent circuits of the ADC 805 during the sampling phase and the conversion phase, respectively, of the next ADC cycle (i.e., the $(k+1)^{th}$ ADC cycle). As discussed further below, the switch 540 shown in FIG. 5 may always be open for noise shaping or omitted.

During the sampling phase of the $k^{th}$ ADC cycle shown in FIG. 9A, the controller 870 causes the switching circuit 810 (shown in FIG. 8) to couple the second terminal 844 of the first capacitor 840 to the input 808 of the ADC 805. This allows the first capacitor 840 to sample the input analog voltage $V_{in}$ with the capacitors (e.g., capacitors 560-1 to 560-N) in the capacitive DAC 420. The controller 870 also causes the switching circuit 810 to couple the second terminal 854 of the second capacitor 850 to the input 832 of the amplifying circuit 830. As discussed further below, the second capacitor 850 holds the residue voltage from the previous ADC cycle (i.e., the $(k-1)^{th}$ ADC cycle).

Also, during the sampling phase of the $k^{th}$ ADC cycle, the controller 870 turns on the switch 860 (shown in FIG. 8) to couple the output 834 of the amplifying circuit 830 to the output 426 of the capacitive DAC 420. As a result, the input 832 of the amplifying circuit 830 is coupled to the second terminal 854 of the second capacitor 850 and the output 834 of the amplifying circuit 830 is coupled to the output 426 of the capacitive DAC 420. This allows the amplifying circuit 830 to transfer the residue voltage from the previous ADC cycle (i.e., the $(k-1)^{th}$ ADC cycle) held on the second capacitor 850 to the output 426 of the capacitive DAC 420. As a result, the residue voltage from the previous ADC cycle (i.e., the $(k-1)^{th}$ ADC cycle) is added to the sampled input analog voltage $V_{in}$, thereby providing noise shaping based on equation (3).

During the conversion phase of the $k^{th}$ ADC cycle shown in FIG. 9B, the controller 870 causes the switching circuit 810 to couple the second terminal 844 of the first capacitor 840 to ground. The controller 870 also causes the switching circuit 810 to decouple the second terminal 854 of the second capacitor 850 from the input 832 of the amplifying circuit 830. As shown in the example in FIG. 9B, the second terminal 854 of the second capacitor 850 may be floating. The controller 870 also turns off the switch 860 to decouple the output 834 of the amplifying circuit 830 from the output 426 of the capacitive DAC 420.

During the conversion phase of the $k^{th}$ ADC cycle, the SAR 340 outputs the digital signal (also referred to as the digital code) to the second input 424 of the capacitive DAC 420 and successively resolves the N bits of the digital signal based on the compare signal from the comparator 330, as discussed above. At the end of the conversion phase, the residue voltage at the output 426 of the capacitive DAC 420 appears across the first capacitor 840. This is because the first capacitor 840 is coupled between the output 426 of the capacitive DAC 420 and the ground. Thus, the first capacitor 840 acquires the residue voltage at the end of the conversion phase of the $k^{th}$ ADC cycle. As discussed further below, the acquired voltage reside of the $k^{th}$ ADC cycle is added to the sampled input analog voltage $V_{in}$ of the next ADC cycle (i.e., the $(k+1)^{th}$ ADC cycle) to provide the noise shaping.

During the sampling phase of the $(k+1)^{th}$ ADC cycle shown in FIG. 9C, the controller 870 causes the switching circuit 810 (shown in FIG. 8) to couple the second terminal 854 of the second capacitor 850 to the input 808 of the ADC 805. This allows the second capacitor 850 to sample the input analog voltage $V_{in}$ with the capacitors (e.g., capacitors 560-1 to 560-N) in the capacitive DAC 420. The controller 870 also causes the switching circuit 810 to couple the second terminal 844 of the first capacitor 840 to the input 832 of the amplifying circuit 830. As discussed above, the first capacitor 840 holds the residue voltage from the $k^{th}$ ADC cycle, which is the previous ADC cycle with respect to the $(k+1)^{th}$ ADC cycle.

Also, during the sampling phase of the $(k+1)^{th}$ ADC cycle, the controller 870 turns on the switch 860 (shown in FIG. 8) to couple the output 834 of the amplifying circuit 830 to the output 426 of the capacitive DAC 420. As a result, the input 832 of the amplifying circuit 830 is coupled to the second terminal 844 of the first capacitor 840 and the output 834 of the amplifying circuit 830 is coupled to the output 426 of the capacitive DAC 420. This allows the amplifying circuit 830 to transfer the residue voltage from the previous ADC cycle (i.e., the $k^{th}$ ADC cycle) held on the first capacitor 840 to the output 426 of the capacitive DAC 420. As a result, the residue voltage from the previous ADC cycle (i.e., the $k^{th}$ ADC cycle) is added to the sampled input analog voltage $V_{in}$, thereby providing noise shaping based on equation (3).

During the conversion phase of the $(k+1)^{th}$ ADC cycle shown in FIG. 9D, the controller 870 causes the switching circuit 810 to couple the second terminal 854 of the second capacitor 850 to ground. The controller 870 also causes the switching circuit 810 to decouple the second terminal 844 of the first capacitor 840 from the input 832 of the amplifying circuit 830. As shown in the example in FIG. 9D, the second terminal 844 of the first capacitor 840 may be floating. The controller 870 also turns off the switch 860 to decouple the output 834 of the amplifying circuit 830 from the output 426 of the capacitive DAC 420.

During the conversion phase of the $(k+1)^{th}$ ADC cycle, the SAR 340 outputs the digital signal to the second input 424 of the capacitive DAC 420 and successively resolves the N bits of the digital signal based on the compare signal from the comparator 330, as discussed above. At the end of the conversion phase, the residue voltage at the output 426 of the capacitive DAC 420 appears across the second capacitor 850. This is because the second capacitor 850 is coupled between the output 426 of the capacitive DAC 420 and the ground. Thus, the second capacitor 850 acquires the residue voltage at the end of the conversion phase of the $(k+1)^{th}$ ADC cycle. The acquired voltage reside of the $(k+1)^{th}$ ADC cycle is added to the sampled input analog voltage $V_{in}$ of the next ADC cycle (i.e., the $(k+2)^{th}$ ADC cycle) to provide the noise shaping. In this regard, the exemplary operations illustrated in FIGS. 9A and 9B are repeated for the $(k+2)^{th}$ ADC cycle, the exemplary operations illustrated in FIGS. 9C and 9D are repeated for the $(k+3)^{th}$ ADC cycle, and so forth.

As discussed above, during the sampling phase of the $k^{th}$ ADC cycle, the second capacitor 850 holds the residue voltage from the previous ADC cycle (i.e., the $(k-1)^{th}$ ADC cycle). This may be accomplished by performing the exemplary operations illustrated in FIGS. 9C and 9D in the previous ADC cycle (i.e., the $(k-1)^{th}$ ADC cycle).

Thus, the exemplary noise shaping scheme illustrated in FIG. 8 alternatively uses the first capacitor 840 and the second capacitor 850 to add the residue voltage from the previous ADC cycle to the sampled input analog voltage $V_{in}$, and alternatively uses the first capacitor 840 and the second capacitor 850 to acquire the residue voltage at the end of the conversion phase. In the example illustrated in FIGS. 9A to 9D, during $k^{th}$ ADC cycle, the second capacitor 850 is used to add the residue voltage from the previous ADC cycle (i.e., the $(k-1)^{th}$ ADC cycle) to the sampled input analog voltage $V_{in}$ and the first capacitor 840 is used to acquire the residue voltage at the end of the conversion phase. During the next ADC cycle (i.e., the $(k+1)^{th}$ ADC cycle), the roles of the first capacitor 840 and the second capacitor 850 switched, in which the first capacitor 840 is used to add the residue voltage from the previous ADC cycle (i.e., the $k^{th}$ ADC cycle) to the sampled input analog voltage $V_{in}$ and the second capacitor 850 is used to acquire the residue voltage at the end of the conversion phase.

Unlike the noise shaping scheme in FIG. 6, the exemplary noise shaping scheme according to aspects of the present disclosure illustrated in FIG. 8 does not use charge sharing between a holding capacitor and the capacitors (e.g., capacitors 560-1 to 560-N) in the capacitive DAC 420 to transfer the residue voltage from the previous ADC cycle to the output 426 of the capacitive DAC 420. Instead, the exemplary noise shaping scheme according to aspects of the present disclosure holds the residue voltage from the previous ADC cycle on the first capacitor 840 or the second capacitor 850, and transfers the held residue voltage to the output 426 of the capacitive DAC 420 using the amplifying circuit 830. Because the exemplary noise shaping scheme according to aspects of the present disclosure does not use charge sharing to transfer the residue voltage, the exemplary noise shaping scheme is able to achieve a $\alpha$ close to one for improved noise shaping (e.g., a low frequencies) without the need for a very large holding capacitor. This allows the first capacitor 840 and the second capacitor 850 to be significantly smaller than the holding capacitor 630 in FIG. 6, thereby significantly reducing the area of the ADC 805 compared with the ADC 605 in FIG. 6.

The first capacitor 840 and the second capacitor 850 may also be used to scale the reference voltage $V_{ref}$ of the capacitive DAC 420. In one example, the first capacitor 840 and the second capacitor 850 may scale the reference voltage $V_{ref}$ of the capacitive DAC 420 by 1/m, where m is a scaling factor. In this example, the relationship between the capacitance of each of the first capacitor 840 and the second capacitor 850 and the scaling factor may be given by:

$$C_f = ((m-1) \cdot 2^N + 1) \cdot C_u \qquad (5)$$

where $C_f$ is the capacitance of each of the first capacitor 840 and the second capacitor 850, and $C_u$ is the unit capacitance discussed above. In this example, the output voltage of the capacitive DAC 420 may be given by:

$$V_{out} = (V_{CM} - V_{in}) + \left(\frac{V_{ref}}{m}\right) \cdot \sum_{k=0}^{N-1} B_k \cdot 2^{(k-N)} \qquad (6)$$

where the reference voltage $V_{ref}$ is scaled by 1/m. In this example, the scaling factor m equals one when each of the first capacitor 840 and the second capacitor 850 has a capacitance equal to the unit capacitance $C_u$. Thus, for use cases where the reference voltage $V_{ref}$ is not scaled, each of the first capacitor 840 and the second capacitor 850 has a capacitance equal to the unit capacitance $C_u$, which is much smaller than the total capacitance of the capacitive DAC 420 and therefore significantly reduces the area of the ADC 805 compared with the ADC 605 in FIG. 6, which includes a holding capacitor 630 typically having a capacitance that is at least ten times greater than the total capacitance of the capacitive DAC 420.

Figure 10:
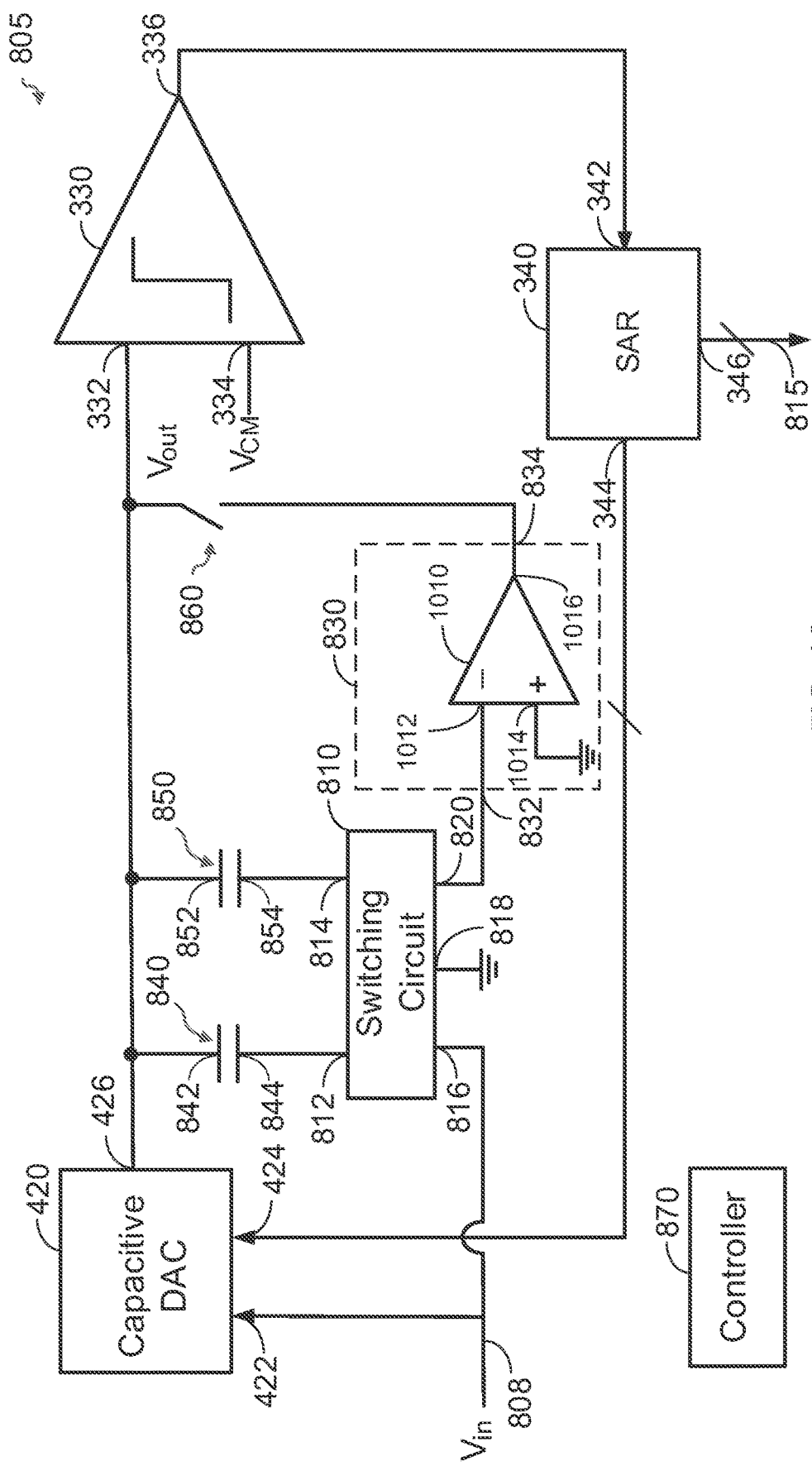
FIG. 10 shows an exemplary implementation of an amplifying circuit according to certain aspects of the present disclosure.

FIG. 10 shows an exemplary implementation of the amplifying circuit 830 according to certain aspects. In this example, the amplifying circuit 830 includes an amplifier 1010 having a first input 1012, a second input 1014, and an output 1016. The first input 1012 may be an inverting input and the second input 1014 may be a non-inverting input, as shown in the example in FIG. 10. In this example, the first input 1012 of the amplifier 1010 is coupled to the input 832 of the amplifying circuit 830, the second input 1014 of the amplifier 1010 is coupled to ground, and the output 1016 of the amplifier 1010 is coupled to the output 834 of the amplifying circuit 830.

Figure 11A:
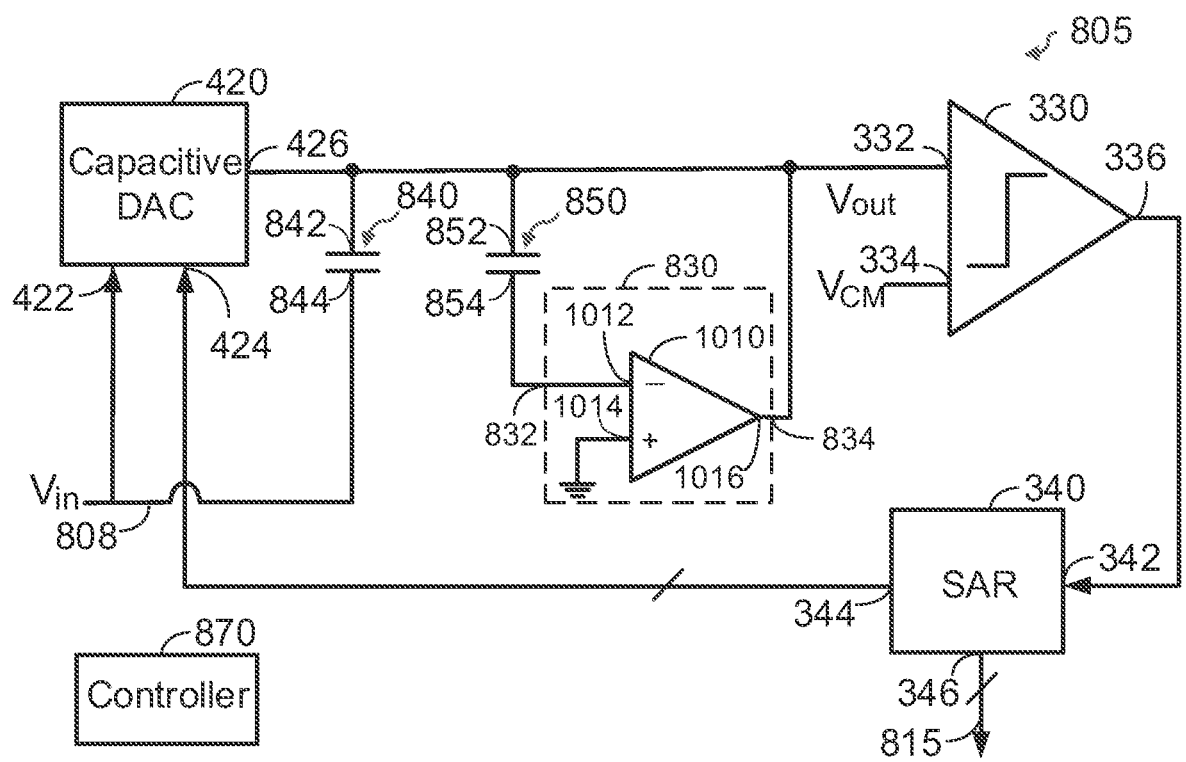
FIG. 11A shows an example of an equivalent circuit of the ADC in FIG. 10 during a sampling phase of a $k^{th}$ ADC cycle according to certain aspects of the present disclosure.
Figure 11B:
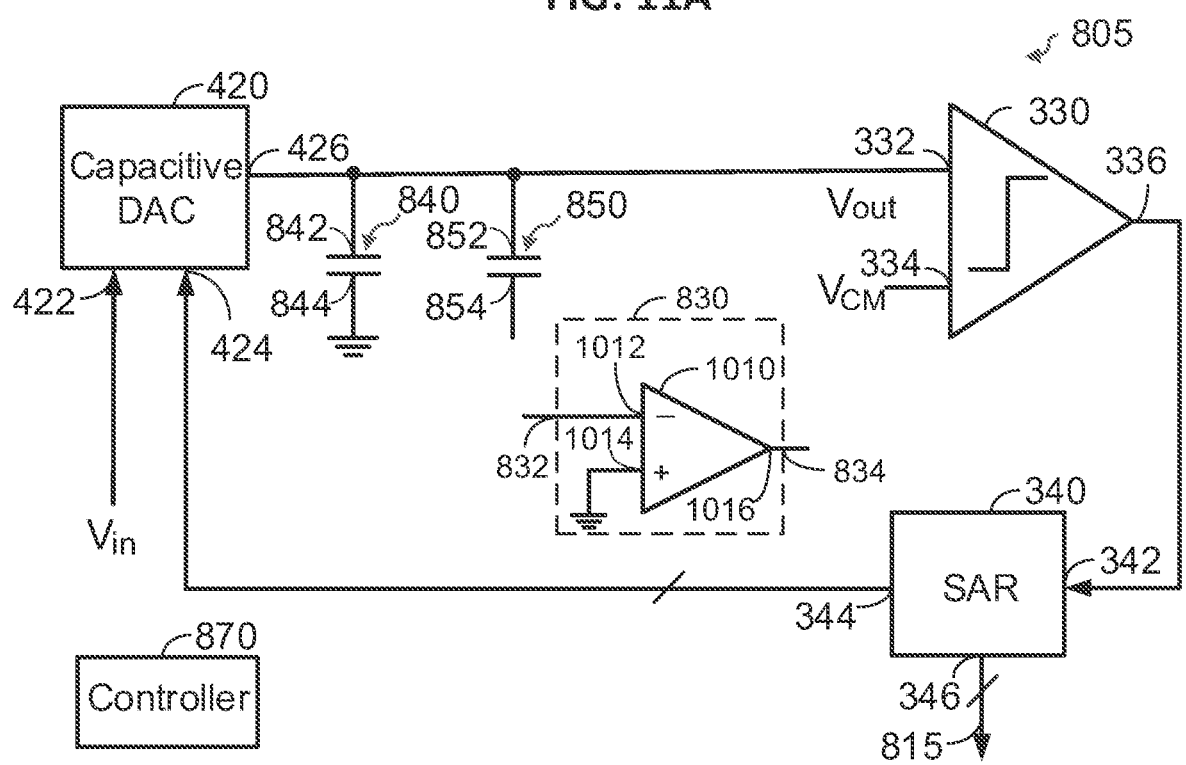
FIG. 11B shows an example of an equivalent circuit of the ADC in FIG. 10 during a conversion phase of the $k^{th}$ ADC cycle according to certain aspects of the present disclosure.
Figure 11C:
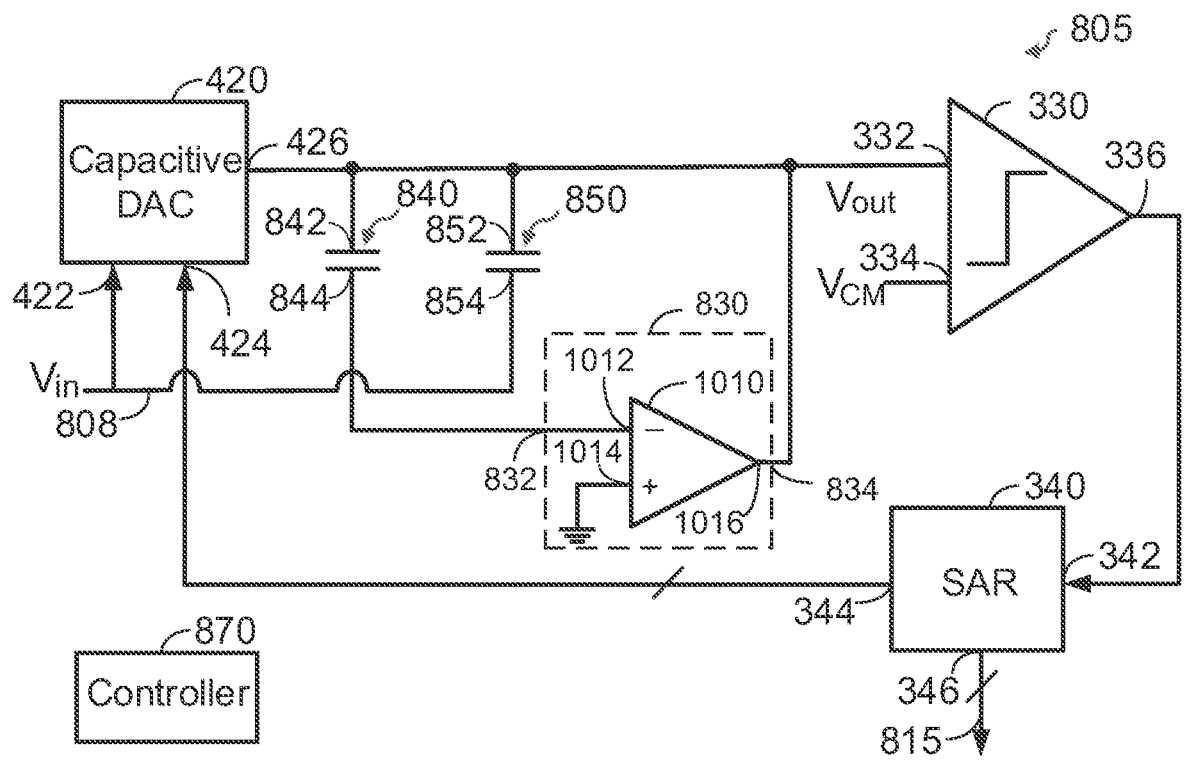
FIG. 11C shows an example of an equivalent circuit of the ADC in FIG. 10 during a sampling phase of a $(k+1)^{th}$ ADC cycle according to certain aspects of the present disclosure.
Figure 11D:
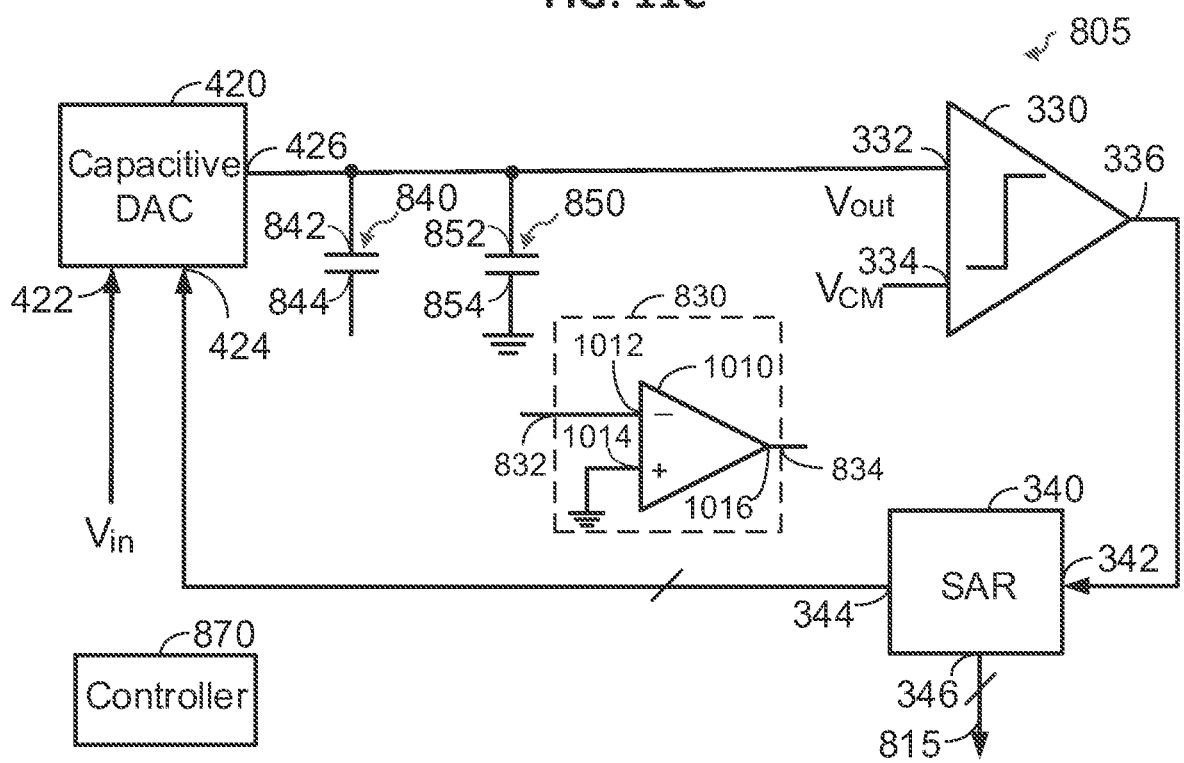
FIG. 11D shows an example of an equivalent circuit of the ADC in FIG. 10 during a conversion phase of the $(k+1)^{th}$ ADC cycle according to certain aspects of the present disclosure.

FIGS. 11A to 11D show examples of equivalent circuits of the ADC 805 during the sampling phase and the conversion phase, respectively, of the $k^{th}$ ADC cycle for the example where the amplifying circuit 830 includes the amplifier 1010. FIGS. 11C and 11D show examples of equivalent circuits of the ADC 805 during the sampling phase and the conversion phase, respectively, of the next ADC cycle (i.e., the (k+1)$^{th}$ ADC cycle) for the example where the amplifying circuit 830 includes the amplifier 1010.

During the sampling phase of the k$^{th}$ ADC cycle shown in FIG. 11A, the second terminal 854 of the second capacitor 850 is coupled to the first input 1012 of the amplifier 1010, and the output 1016 of the amplifier 1010 is coupled to the output 426 of the capacitive DAC 420. This allows the amplifier 1010 to transfer the residue voltage from the previous ADC cycle (i.e., the (k−1)$^{th}$ ADC cycle) held on the second capacitor 850 to the output 426 of the capacitive DAC 420 for noise shaping, as discussed above.

During the conversion phase of the k$^{th}$ ADC cycle shown in FIG. 11B, the first input 1012 of the amplifier 1010 is decoupled from the second terminal 854 of the second capacitor 850, and the output 1016 of the amplifier 1010 is decoupled from the output 426 of the capacitive DAC 420.

During the sampling phase of the (k+1)$^{th}$ ADC cycle shown in FIG. 11C, the second terminal 844 of the first capacitor 840 is coupled to the first input 1012 of the amplifier 1010, and the output 1016 of the amplifier 1010 is coupled to the output 426 of the capacitive DAC 420. This allows the amplifier 1010 to transfer the residue voltage from the previous ADC cycle (i.e., the k$^{th}$ ADC cycle) held on the first capacitor 840 to the output 426 of the capacitive DAC 420 for noise shaping, as discussed above.

During the conversion phase of the (k+1)$^{th}$ ADC cycle shown in FIG. 11D, the first input 1012 of the amplifier 1010 is decoupled from the second terminal 844 of the first capacitor 840, and the output 1016 of the amplifier 1010 is decoupled from the output 426 of the capacitive DAC 420.

Thus, in this example, the amplifier 1010 is used to transfer the residue voltage from the previous ADC cycle held on the first capacitor 840 or the second capacitor 850 the output 426 of the capacitive DAC 420 to provide noise shaping. The residue voltage has a relatively small voltage swing since the residue voltage is the difference between the sampled analog input voltage V$_{in}$ and the voltage corresponding to the resolved bits of the digital signal at the end of the conversation phase. Because the residue voltage has a small voltage swing, the amplifier 1010 does not need to be implemented with a high-performance amplifier having high linearity over a large voltage swing. This relaxes the performance requirements of the amplifier 1010, allowing the amplifier 1010 to be implemented with a lower-performance amplifier in advanced technologies operating at a low supply voltage for reduced power consumption.

Figure 12:
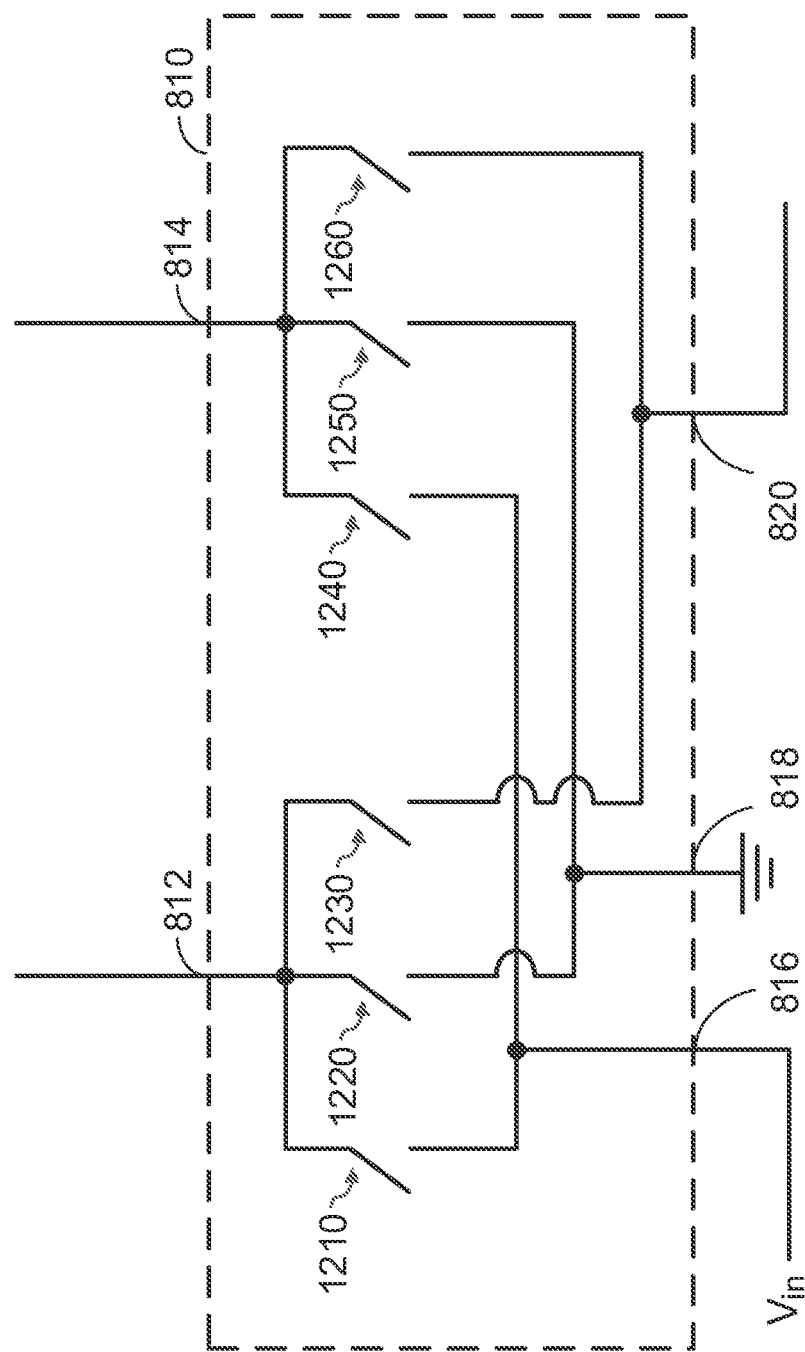
FIG. 12 shows an exemplary implementation of a switching circuit according to certain aspects of the present disclosure.

FIG. 12 shows an exemplary implementation of the switching circuit 810 according to certain aspects. In this example, the switching circuit 810 includes a first switch 1210, a second switch 1220, a third switch 1230, a fourth switch 1240, a fifth switch 1250, and a sixth switch 1260. Each of the first switch 1210, the second switch 1220, the third switch 1230, the fourth switch 1240, the fifth switch 1250, and the sixth switch 1260 may be implemented with one or more transistors, a transmission gate, or another type of switch.

The first switch 1210 is coupled between the first terminal 812 and the third terminal 816, the second switch 1220 is coupled between the first terminal 812 and the fourth terminal 818, and the third switch 1230 is coupled between the first terminal 812 and the fifth terminal 820. The fourth switch 1240 is coupled between the second terminal 814 and the third terminal 816, the fifth switch 1250 is coupled between the second terminal 814 and the fourth terminal 818, and the sixth switch 1260 is coupled between the second terminal 814 and the fifth terminal 820. The controller 870 (shown in FIG. 8) controls switching of the first switch 1210, the second switch 1220, the third switch 1230, the fourth switch 1240, the fifth switch 1250, and the sixth switch 1260. For ease of illustration, the individual connection between the controller 870 and each of the first switch 1210, the second switch 1220, the third switch 1230, the fourth switch 1240, the fifth switch 1250, and the sixth switch 1260 is not shown in FIG. 12.

Exemplary switching operations will now be discussed according to certain aspects. During the sampling phase of the k$^{th}$ ADC cycle discussed above, the controller 870 turns on (i.e., closes) the first switch 1210 to couple the second terminal 844 of the first capacitor 840 to the input 808 of the ADC 805 and turns on (i.e., closes) the sixth switch 1260 to couple the second terminal 854 of the second capacitor 850 is coupled to the input 832 of the amplifying circuit 830. The controller 870 turns off the second switch 1220, the third switch 1230, the fourth switch 1240, and the fifth switch 1250.

During the conversion phase of the k$^{th}$ ADC cycle discussed above, the controller 870 turns on (i.e., closes) the second switch 1220 to couple the second terminal 844 of the first capacitor 840 to the ground. The controller 870 turns off the first switch 1210, the third switch 1230, the fourth switch 1240, the fifth switch 1250, and the sixth switch 1260.

During the sampling phase of the (k+1)$^{th}$ ADC cycle discussed above, the controller 870 turns on (i.e., closes) the third switch 1230 to couple the second terminal 844 of the first capacitor 840 to the input 832 of the amplifying circuit 830 and turns on (i.e., closes) the fourth switch 1240 to couple the second terminal 854 of the second capacitor 850 to the input 808 of the ADC 805. The controller 870 turns off the first switch 1210, the second switch 1220, the fifth switch 1250, and the sixth switch 1260.

During the conversion phase of the (k+1)$^{th}$ ADC cycle discussed above, the controller 870 turns on (i.e., closes) the fifth switch 1250 to couple the second terminal 854 of the second capacitor 850 to the ground. The controller 870 turns off the first switch 1210, the third switch 1230, the third switch 1230, fourth switch 1240, and the sixth switch 1260.

In the above examples, the sampling phase of the k$^{th}$ ADC cycle may also be referred to as a first sampling phase and the sampling phase of the (k+1)$^{th}$ ADC cycle may also be referred to as a second sampling phase. Similarly, the conversion phase of the k$^{th}$ ADC cycle may be also referred to as a first conversion phase and the conversion phase of the (k+1)$^{th}$ ADC cycle may also be referred to as a second conversion phase.

Figure 13:
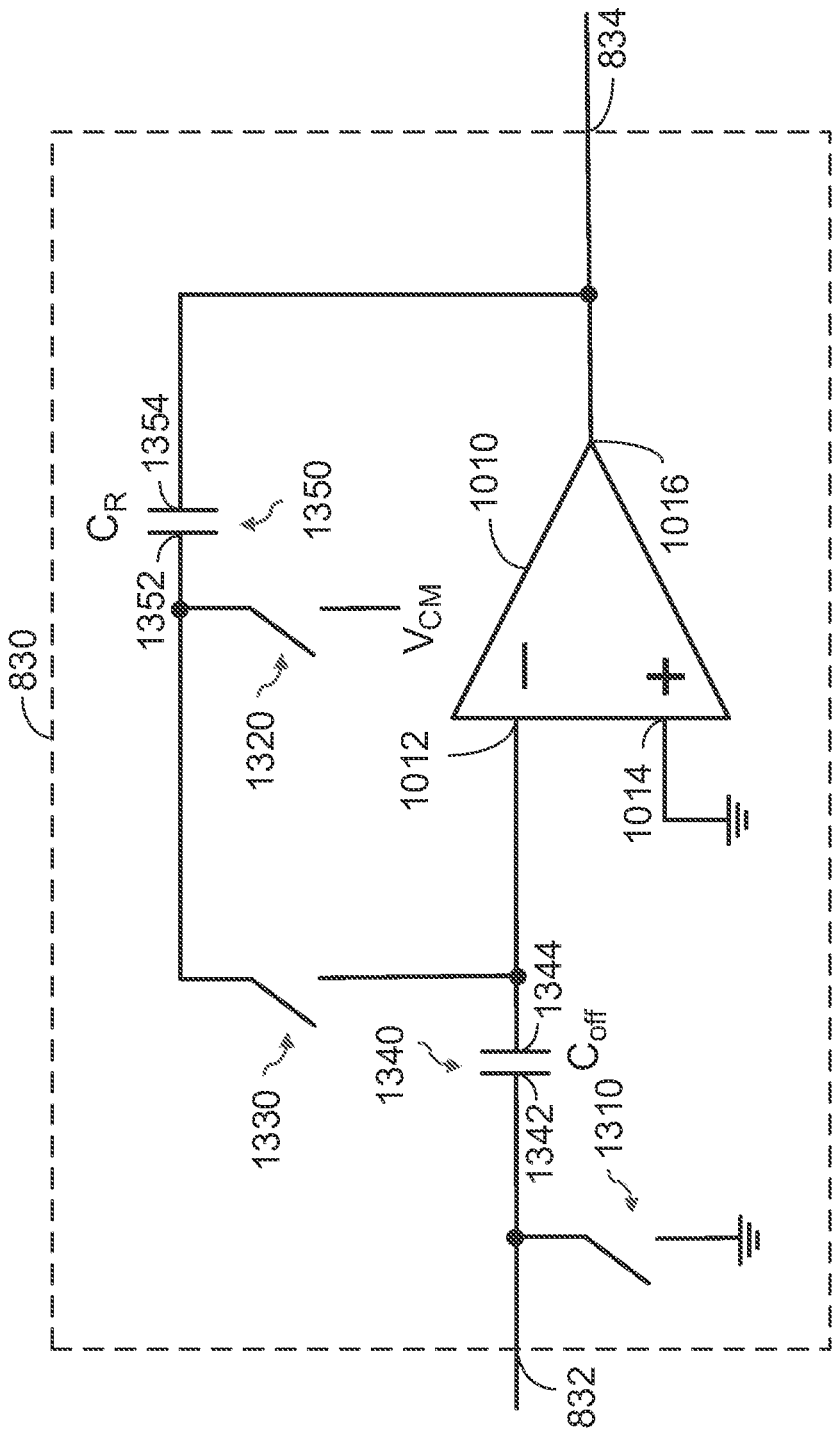
FIG. 13 shows an exemplary implementation of an amplifying circuit including an auto-zeroing circuit according to certain aspects of the present disclosure.

FIG. 13 shows another exemplary implementation of the amplifying circuit 830 according to certain aspects. In this example, the amplifying circuit 830 includes the amplifier 1010 discussed above. The amplifying circuit 830 also includes an auto-zeroing circuit to reduce offset and low-frequency errors. The auto-zeroing circuit includes a first switch 1310, a second switch 1320, a third switch 1330, a first capacitor 1340 (labeled "C$_{off}$"), and a second capacitor 1350 (labeled "C$_R$").

The first switch 1310 is coupled between the input 832 of the amplifying circuit 830 and ground. The first capacitor 1340 is coupled between the first input 1012 of the amplifier 1010 and the input 832 of the amplifying circuit 830. More particularly, a first terminal 1342 of the first capacitor 1340 is coupled to the input 832 of the amplifying circuit 830 and a second terminal 1344 of the first capacitor 1340 is coupled to the first input 1012 of the amplifier 1010. The second switch 1320 is coupled between a first terminal 1352 of the second capacitor 1350 and the common mode voltage $V_{CM}$. A second terminal 1354 of the second capacitor 1350 is coupled to the output 1016 of the amplifier 1010. The third switch 1330 is coupled between first terminal 1352 of the second capacitor 1350 and the first input 1012 of the amplifier 1010. Switching of the first switch 1310, the second switch 1320, and the third switch 1330 may be controlled by the controller 870, as discussed further below.

Exemplary auto-zeroing operations will now be discussed below according to aspects of the present disclosure.

Figure 14A:
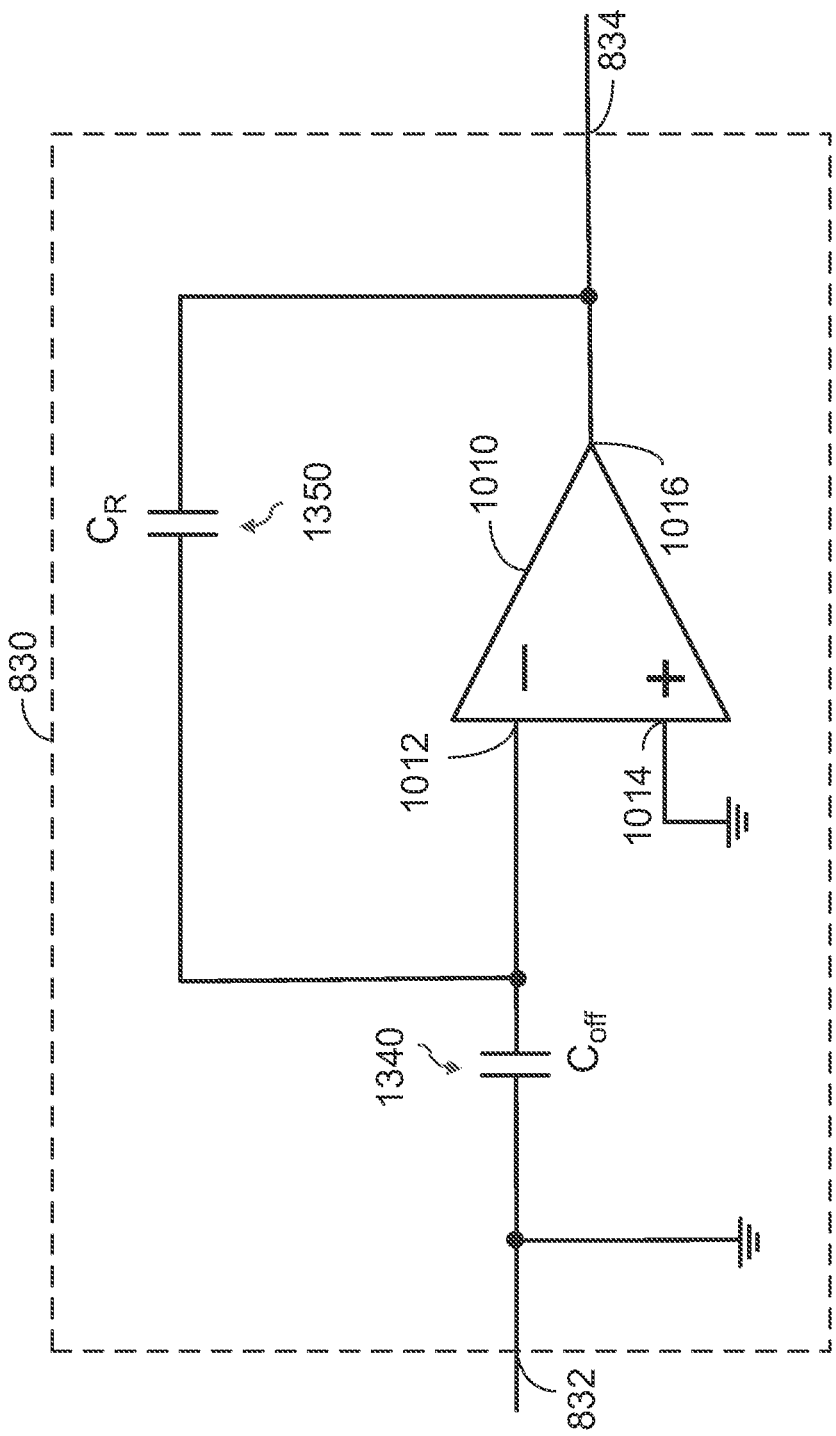
FIG. 14A shows an example of an equivalent circuit of the amplifying circuit during an auto-zeroing phase according to certain aspects of the present disclosure.

During an auto-zeroing (AZ) phase, the controller 870 turns on (i.e., closes) the first switch 1310 and the third switch 1330, and turns off the second switch 1320. In this regard, FIG. 14A shows an example of an equivalent circuit of the amplifying circuit 830 during the AZ phase. The AZ phase occurs within a conversion phase during which time the input 832 of the amplifying circuit 830 is decoupled from the first capacitor 840 and the second capacitor 850, and the output 834 of the amplifying circuit 830 is decoupled from the output 426 of the capacitive DAC 420.

As shown in FIG. 14A, during the AZ phase, the output 1016 of the amplifier 1010 is coupled to the first input 1012 of the amplifier 1010 via the second capacitor 1350, which sets the amplifier 1010 into a unity gain configuration. The second capacitor 1350 stores offset and low-frequency errors. Because of the unity gain configuration of the amplifier 1010 during the AZ phase, the negative of the offset and low-frequency errors appears on the first capacitor 1340, which is coupled between the first input 1012 of the amplifier 1010 and the input 832 of the amplifying circuit 830.

Figure 14B:
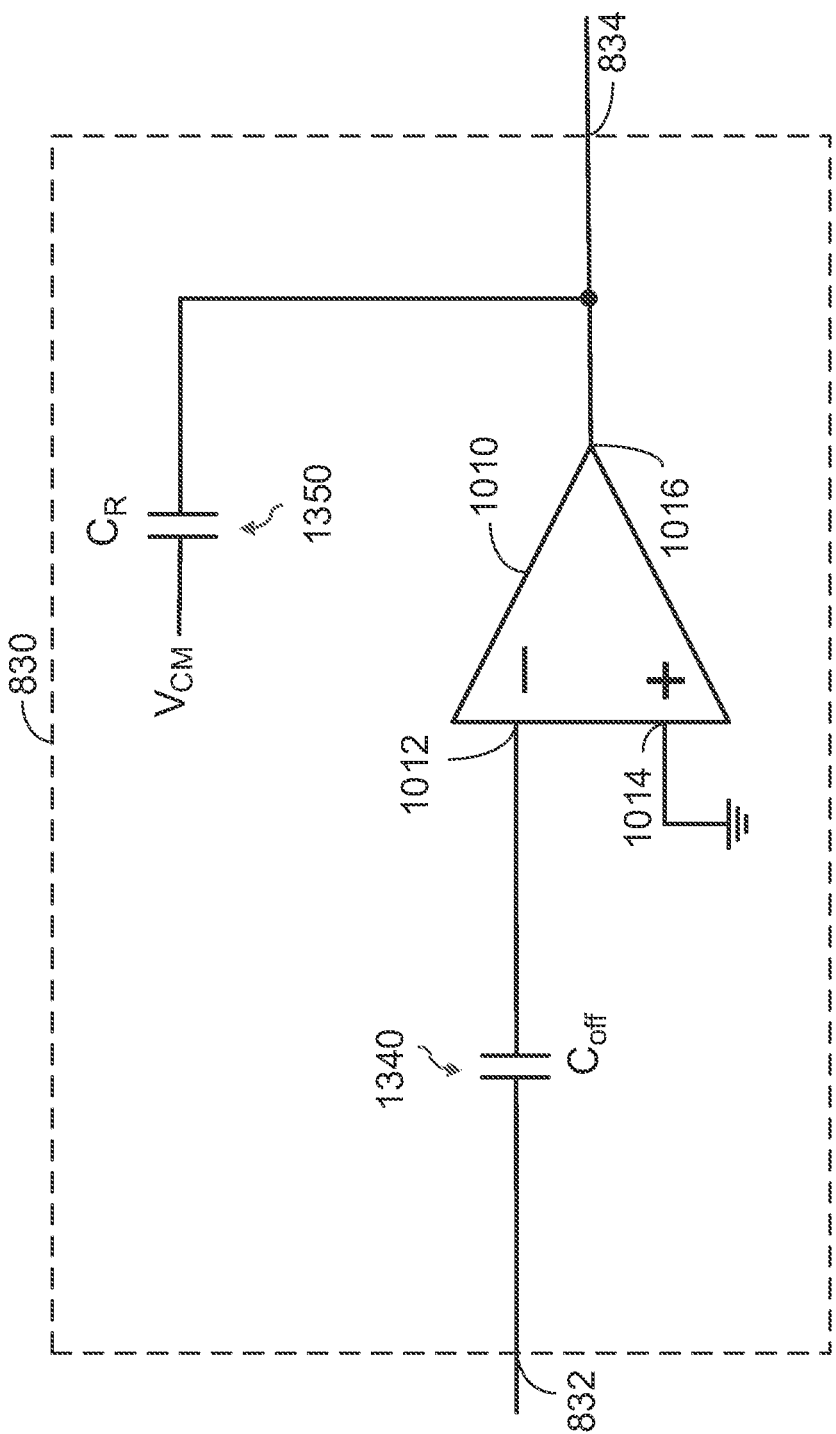
FIG. 14B shows an example of an equivalent circuit of the amplifying circuit during a sampling phase according to certain aspects of the present disclosure.

During a sampling phase following the AZ phase, the controller 870 turns off the first switch 1310 and the third switch 1330, and turns on the second switch 1320. In this regard, FIG. 14B shows an example of an equivalent circuit of the amplifying circuit 830 during the sampling phase. The input 832 of the amplifying circuit 830 is coupled to one of the first capacitor 840 and the second capacitor 850, and the output 834 of the amplifying circuit 830 is coupled to the output 426 of the capacitive DAC 420.

Because the first capacitor 1340 stores the negative of the offset and low-frequency errors as discussed above, the offset and low-frequency errors are subtracted from the charge stored on the first capacitor 840 or the second capacitor 850. As a result, the residue voltage from the first capacitor 840 or the second capacitor 850 is not affected by the offset and low-frequency errors in the amplifier 1010.

As shown in FIG. 14B, in this example, the common mode voltage $V_{CM}$ is coupled to the output 1016 of the amplifier 1010 via the second capacitor 1350 during the sampling phase. As a result, the output of the amplifying circuit 830 provides the common mode voltage $V_{CM}$ and the residue voltage from the previous ADC cycle to the output 426 of the capacitive DAC 420. In this example, the switch 540 shown in example in FIG. 5 may be omitted since the common mode voltage $V_{CM}$ is provided by the amplifying circuit 830 during the sampling phase in this example or the switch 540 may always be open for noise shaping.

The exemplary auto-zeroing operation illustrated in FIG. 14A may be performed during the conversion phase of each ADC cycle of the ADC 805.

Figure 15:
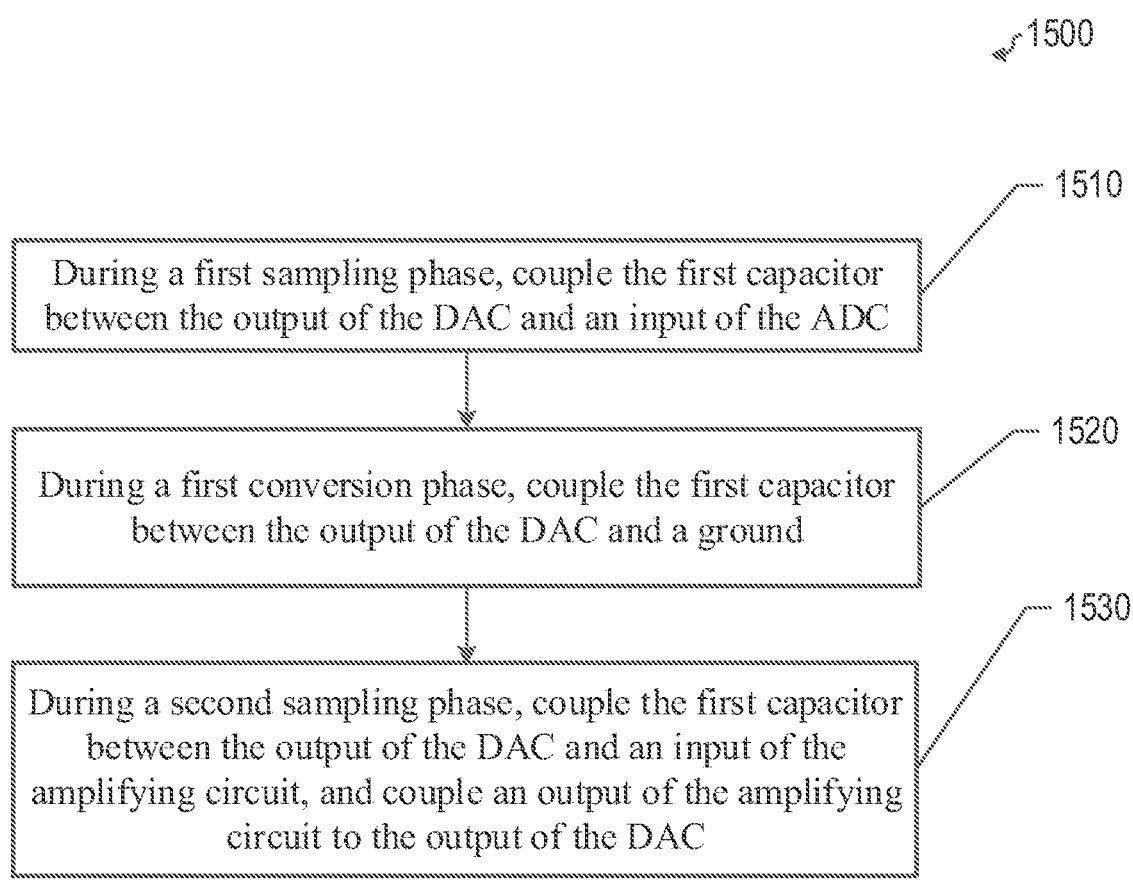
FIG. 15 is a flowchart illustrating a method for noise shaping according to certain aspects of the present disclosure.

FIG. 15 illustrates a method 1500 for noise shaping in an analog-to-digital converter (ADC) according to certain aspects. The ADC (e.g., ADC 805) includes a digital-to-analog converter (DAC) (e.g., capacitive DAC 420) having an output (e.g., output 426), a comparator (e.g., comparator 330) having a first input (e.g., first input 332) coupled to the output of the DAC and a second input (e.g., second input 334) coupled to a common mode voltage or a ground, a first capacitor (e.g., first capacitor 840), and an amplifying circuit (e.g., amplifying circuit 830).

At block 1510, during a first sampling phase, the first capacitor is coupled between the output of the DAC and an input of the ADC. For example, the first capacitor may be coupled between the output of the DAC and the input (e.g., input 808) of the ADC by the switching circuit 810. In certain aspects, the first sampling phase may correspond to the sampling phase of the $k^{th}$ ADC cycle.

At block 1520, during a first conversion phase, the first capacitor is coupled between the output of the DAC and a ground. For example, first capacitor may be coupled between the output of the DAC and the ground by the switching circuit 810. This may be done, for example, to acquire a residue voltage at the output of the DAC at the end of the first conversion phase. In certain aspects, the first conversion phase may correspond to the conversion phase of the $k^{th}$ ADC cycle.

At block 1530, during a second sampling phase, the first capacitor is coupled between the output of the DAC and an input of the amplifying circuit, and an output of the amplifying circuit is coupled to the output of the DAC. For example, the first capacitor may be coupled between the output of the DAC and the input (e.g., input 832) of the amplifying circuit by the switching circuit 810 and the output (e.g., output 834) of the amplifying circuit may be coupled to the output of the DAC by the switch 860. In certain aspects, the second phase may correspond to the sampling phase of the $(k+1)^{th}$ ADC cycle.

In certain aspects, the ADC also includes a second capacitor (e.g., the second capacitor 850). In these aspects, the method 1500 may also include, during the first sampling phase, coupling the second capacitor between the output of the DAC and the input of the amplifying circuit, and coupling the output of the amplifying circuit to the output of the DAC. The method 1500 may also include, during the second sampling phase, coupling the second capacitor between the output of the DAC and the input of the ADC, and during a second conversion phase, coupling the second capacitor between the output of the DAC and the ground. The second conversion phase may correspond to the conversion phase of the $(k+1)^{th}$ ADC cycle. The couplings may be performed by the switching circuit 810 and/or the switch 860.

The method 1500 may also include, during each of the first conversion phase and the second conversion phase, outputting a digital signal to the DAC, and resolving N bits of the digital signal based on a compare signal from an output of the comparator. For example, the digital signal may be output by the SAR 340, and the N bits of the digital signal may be resolved by the SAR 340 based on the compare signal from the output (e.g., output 336) of the comparator.

The SAR 340 and the controller 870 may each be implemented with an application specific integrated circuit (ASIC), a field programmable gate array (FPGA) or other programmable logic device, flip-flops, discrete hardware components (e.g., logic gates), a state machine, or any combination thereof.

Implementation examples are described in the following numbered clauses:

1. An analog-to-digital converter (ADC), comprising:
   a comparator having a first input, a second input, and an output;
   a digital-to-analog converter (DAC) coupled to the first input of the comparator;

a switching circuit;
a first capacitor coupled between the first input of the comparator and the switching circuit;
a second capacitor coupled between the first input of the comparator and the switching circuit;
an amplifying circuit having an input and an output, wherein the input of the amplifying circuit is coupled to the switching circuit;
a first switch coupled between the output of the amplifying circuit and the DAC; and
a successive approximation register (SAR) having an input and an output, wherein the input of the SAR is coupled to the output of the comparator, and the output of the SAR is coupled to the DAC.

2. The ADC of clause 1, wherein the second input of the comparator is coupled to a common mode voltage or a ground.

3. The ADC of clause 1 or 2, wherein the DAC comprises a capacitive DAC.

4. The ADC of any one of clauses 1 to 3, wherein the amplifying circuit comprises:
an amplifier having a first input, a second input, and an output, wherein the first input of the amplifier is coupled to the input of the amplifying circuit, and the output of the amplifier is coupled to the output of the amplifying circuit.

5. The ADC of clause 4, wherein the second input of the amplifier is coupled to a ground.

6. The ADC of clause 4 or 5, further comprising a controller configured to:
during a sampling phase, turn on the first switch; and
during a conversion phase, turn off the first switch.

7. The ADC of clause 6, wherein, during the conversion phase, the SAR is configured to:
output a digital signal to the DAC; and
resolve N bits of the digital signal based on a compare signal from the output of the comparator.

8. The ADC of any one of clauses 4 to 7, wherein the amplifying circuit further comprises a second switch coupled between the output of the amplifier and the first input of the amplifier.

9. The ADC of clause 8, wherein the amplifying circuit further comprises a third switch coupled between the first input of the amplifier and a ground.

10. The ADC of clause 9, further comprising a controller configured to:
during a sampling phase, turn on the first switch, turn off the second switch, and turn off the third switch; and
during a conversion phase, turn off the first switch, turn on the second switch, and turn on the third switch.

11. The ADC of clause 10, wherein, during the conversion phase, the SAR is configured to:
output a digital signal to the DAC; and
resolve N bits of the digital signal based on a compare signal from the output of the comparator.

12. The ADC of any one of clauses 9 to 11, wherein the amplifying circuit further comprises a fourth switch coupled between the output of the amplifier and a common mode voltage.

13. The ADC of any one of clauses 1 to 12, wherein the switching circuit comprises:
a second switch coupled between a terminal of the first capacitor and an input of the ADC;
a third switch coupled between a terminal of the second capacitor and the input of the ADC;
a fourth switch coupled between the terminal of the first capacitor and the input of the amplifying circuit; and a fifth switch coupled between the terminal of the second capacitor and the input of the amplifying circuit.

14. The ADC of clause 13, further comprising a controller configured to:
during a first sampling phase, turn on the second switch, turn off the third switch, turn off the fourth switch, and turn on the fifth switch; and
during a second sampling phase, turn off the first switch, turn on the third switch, turn on the fourth switch, and turn off the fifth switch.

15. The ADC of clause 13 or 14, wherein the switching circuit further comprises:
a sixth switch coupled between the terminal of the first capacitor and a ground; and
a seventh switch coupled between the terminal of the second capacitor and the ground.

16. The ADC of clause 15, further comprising a controller configured to:
during a first sampling phase, turn on the second switch, turn off the third switch, turn off the fourth switch, turn on the fifth switch, turn off the sixth switch, and turn off the seventh switch;
during a first conversion phase, turn off the second switch, turn off the third switch, turn off the fourth switch, turn off the fifth switch, turn on the sixth switch, and turn off the seventh switch;
during a second sampling phase, turn off the second switch, turn on the third switch, turn on the fourth switch, turn off the fifth switch, turn off the sixth switch, and turn off the seventh switch; and
during a second conversion phase, turn off the second switch, turn off the third switch, turn off the fourth switch, turn off the fifth switch, turn off the sixth switch, and turn on the seventh switch.

17. The ADC of clause 16, wherein, during each of the first conversion phase and the second the conversion phase, the SAR is configured to:
output a digital signal to the DAC; and
resolve N bits of the digital signal based on a compare signal from the output of the comparator.

18. The ADC of clause 16 or 17, wherein, during each of the first sampling phase and the second the sampling phase, the controller is configured to turn on the first switch.

19. The ADC of clause 18, wherein, during each of the first conversion phase and the second the conversion phase, the controller is configured to turn off the first switch.

20. The ADC of any one of clauses 1 to 12, wherein the switching circuit is configured to:
during a first sampling phase, couple a terminal of the first capacitor to an input of the ADC and couple a terminal of the second capacitor to the input of the amplifying circuit; and
during a second sampling phase, couple the terminal of the second capacitor to the input of the ADC and couple the terminal of the first capacitor to the input of the amplifying circuit.

21. The ADC of clause 20, wherein the switching circuit is further configured to:
during a first conversion phase, couple the terminal of the first capacitor to a ground; and
during a second conversion phase, couple the terminal of the second capacitor to the ground.

22. The ADC of clause 21, wherein the switching circuit is further configured to:
during the first conversion phase, float the terminal of the second capacitor; and during the second conversion phase, float the terminal of the first capacitor.

23. The ADC of clause 21 or 22, wherein, during each of the first conversion phase and the second the conversion phase, the SAR is configured to:
output a digital signal to the DAC; and
resolve N bits of the digital signal based on a compare signal from the output of the comparator.

24. A system, comprising:
an analog-to-digital converter (ADC), comprising:
a comparator having a first input, a second input, and an output;
a digital-to-analog converter (DAC) coupled to an input of the ADC and the first input of the comparator;
a switching circuit coupled to the input of the ADC;
a first capacitor coupled between the first input of the comparator and the switching circuit;
a second capacitor coupled between the first input of the comparator and the switching circuit;
an amplifying circuit having an input and an output, wherein the input of the amplifying circuit is coupled to the switching circuit;
a first switch coupled between the output of the amplifying circuit and the DAC; and
a successive approximation register (SAR) having an input, a first output, and a second output, wherein the input of the SAR is coupled to the output of the comparator, the first output of the SAR is coupled to the DAC, and the second output is coupled to an output of the ADC;
a receiver coupled to the input of the ADC; and
a processor coupled to the output of the ADC.

25. A method for noise shaping in an analog-to-digital converter (ADC), wherein the ADC includes a digital-to-analog converter (DAC) having an output, a comparator having a first input coupled to the output of the DAC and a second input coupled to a common mode voltage or a ground, a first capacitor, and an amplifying circuit, the method comprising:
during a first sampling phase,
coupling the first capacitor between the output of the DAC and an input of the ADC;
during a first conversion phase,
coupling the first capacitor between the output of the DAC and a ground; and
during a second sampling phase,
coupling the first capacitor between the output of the DAC and an input of the amplifying circuit; and
coupling an output of the amplifying circuit to the output of the DAC.

26. The method of clause 25, wherein the ADC also includes a second capacitor, and the method further comprises:
during the first sampling phase,
coupling the second capacitor between the output of the DAC and the input of the amplifying circuit; and
coupling the output of the amplifying circuit to the output of the DAC;
during the second sampling phase,
coupling the second capacitor between the output of the DAC and the input of the ADC; and
during a second conversion phase,
coupling the second capacitor between the output of the DAC and the ground.

27. The method of clause 26, further comprising:
during each of the first conversion phase and the second conversion phase,
outputting a digital signal to the DAC; and
resolving N bits of the digital signal based on a compare signal from an output of the comparator.

It is to be appreciated that the present disclosure is not limited to the exemplary terminology used above to describe aspects of the present disclosure. For example, a sampling phase may also be referred to as an acquisition phase or another term. In another example, a digital signal may also be referred to as a digital code or another term. In another example, a SAR may also be referred to as SAR logic, a SAR circuit, or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element. It is also to be appreciated that numerical designations in the claims do not necessarily match the numerical designations in the description.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An analog-to-digital converter (ADC), comprising:
a comparator having a first input, a second input, and an output;
a digital-to-analog converter (DAC) coupled to the first input of the comparator;
a switching circuit;
a first capacitor coupled between the first input of the comparator and the switching circuit;
a second capacitor coupled between the first input of the comparator and the switching circuit;
an amplifying circuit having an input and an output, wherein the input of the amplifying circuit is coupled to the switching circuit;
a first switch coupled between the output of the amplifying circuit and the DAC; and
a successive approximation register (SAR) having an input and an output, wherein the input of the SAR is coupled to the output of the comparator, and the output of the SAR is coupled to the DAC.

2. The ADC of claim 1, wherein the second input of the comparator is coupled to a common mode voltage or a ground.

3. The ADC of claim 1, wherein the DAC comprises a capacitive DAC.

4. The ADC of claim 1, wherein the amplifying circuit comprises:
an amplifier having a first input, a second input, and an output, wherein the first input of the amplifier is coupled to the input of the amplifying circuit, and the output of the amplifier is coupled to the output of the amplifying circuit.

5. The ADC of claim 4, wherein the second input of the amplifier is coupled to a ground.

6. The ADC of claim 4, further comprising a controller configured to:
during a sampling phase, turn on the first switch; and
during a conversion phase, turn off the first switch.

7. The ADC of claim 6, wherein, during the conversion phase, the SAR is configured to:
output a digital signal to the DAC; and
resolve N bits of the digital signal based on a compare signal from the output of the comparator.

8. The ADC of claim 4, wherein the amplifying circuit further comprises a second switch coupled between the output of the amplifier and the first input of the amplifier.

9. The ADC of claim 8, wherein the amplifying circuit further comprises a third switch coupled between the first input of the amplifier and a ground.

10. The ADC of claim 9, further comprising a controller configured to:
during a sampling phase, turn on the first switch, turn off the second switch, and turn off the third switch; and
during a conversion phase, turn off the first switch, turn on the second switch, and turn on the third switch.

11. The ADC of claim 10, wherein, during the conversion phase, the SAR is configured to:
output a digital signal to the DAC; and
resolve N bits of the digital signal based on a compare signal from the output of the comparator.

12. The ADC of claim 9, wherein the amplifying circuit further comprises a fourth switch coupled between the output of the amplifier and a common mode voltage.

13. The ADC of claim 1, wherein the switching circuit comprises:
a second switch coupled between a terminal of the first capacitor and an input of the ADC;
a third switch coupled between a terminal of the second capacitor and the input of the ADC;
a fourth switch coupled between the terminal of the first capacitor and the input of the amplifying circuit; and
a fifth switch coupled between the terminal of the second capacitor and the input of the amplifying circuit.

14. The ADC of claim 13, further comprising a controller configured to:
during a first sampling phase, turn on the second switch, turn off the third switch, turn off the fourth switch, and turn on the fifth switch; and
during a second sampling phase, turn off the first switch, turn on the third switch, turn on the fourth switch, and turn off the fifth switch.

15. The ADC of claim 13, wherein the switching circuit further comprises:
a sixth switch coupled between the terminal of the first capacitor and a ground; and
a seventh switch coupled between the terminal of the second capacitor and the ground.

16. The ADC of claim 15, further comprising a controller configured to:
during a first sampling phase, turn on the second switch, turn off the third switch, turn off the fourth switch, turn on the fifth switch, turn off the sixth switch, and turn off the seventh switch;
during a first conversion phase, turn off the second switch, turn off the third switch, turn off the fourth switch, turn off the fifth switch, turn on the sixth switch, and turn off the seventh switch;
during a second sampling phase, turn off the second switch, turn on the third switch, turn on the fourth switch, turn off the fifth switch, turn off the sixth switch, and turn off the seventh switch; and
during a second conversion phase, turn off the second switch, turn off the third switch, turn off the fourth switch, turn off the fifth switch, turn off the sixth switch, and turn on the seventh switch.

17. The ADC of claim 16, wherein, during each of the first conversion phase and the second the conversion phase, the SAR is configured to:
output a digital signal to the DAC; and
resolve N bits of the digital signal based on a compare signal from the output of the comparator.

18. The ADC of claim 16, wherein, during each of the first sampling phase and the second the sampling phase, the controller is configured to turn on the first switch.

19. The ADC of claim 18, wherein, during each of the first conversion phase and the second the conversion phase, the controller is configured to turn off the first switch.

20. The ADC of claim 1, wherein the switching circuit is configured to:
during a first sampling phase, couple a terminal of the first capacitor to an input of the ADC and couple a terminal of the second capacitor to the input of the amplifying circuit; and
during a second sampling phase, couple the terminal of the second capacitor to the input of the ADC and couple the terminal of the first capacitor to the input of the amplifying circuit.

21. The ADC of claim 20, wherein the switching circuit is further configured to:
during a first conversion phase, couple the terminal of the first capacitor to a ground; and
during a second conversion phase, couple the terminal of the second capacitor to the ground.

22. The ADC of claim 21, wherein the switching circuit is further configured to:
during the first conversion phase, float the terminal of the second capacitor; and
during the second conversion phase, float the terminal of the first capacitor.

23. The ADC of claim 21, wherein, during each of the first conversion phase and the second the conversion phase, the SAR is configured to:
output a digital signal to the DAC; and
resolve N bits of the digital signal based on a compare signal from the output of the comparator.

24. A system, comprising:
an analog-to-digital converter (ADC), comprising:
a comparator having a first input, a second input, and an output;
a digital-to-analog converter (DAC) coupled to an input of the ADC and the first input of the comparator;
a switching circuit coupled to the input of the ADC;
a first capacitor coupled between the first input of the comparator and the switching circuit;
a second capacitor coupled between the first input of the comparator and the switching circuit;

an amplifying circuit having an input and an output, wherein the input of the amplifying circuit is coupled to the switching circuit;

a first switch coupled between the output of the amplifying circuit and the DAC; and a successive approximation register (SAR) having an input, a first output, and a second output, wherein the input of the SAR is coupled to the output of the comparator, the first output of the SAR is coupled to the DAC, and the second output is coupled to an output of the ADC;

a receiver coupled to the input of the ADC; and a processor coupled to the output of the ADC.

25. A method for noise shaping in an analog-to-digital converter (ADC), wherein the ADC includes a digital-to-analog converter (DAC) having an output, a comparator having a first input coupled to the output of the DAC and a second input coupled to a common mode voltage or a ground, a first capacitor, and an amplifying circuit, the method comprising:

during a first sampling phase,
coupling the first capacitor between the output of the DAC and an input of the ADC;

during a first conversion phase,
coupling the first capacitor between the output of the DAC and a ground; and during a second sampling phase,
coupling the first capacitor between the output of the DAC and an input of the amplifying circuit; and
coupling an output of the amplifying circuit to the output of the DAC.

26. The method of claim 25, wherein the ADC also includes a second capacitor, and the method further comprises:

during the first sampling phase,
coupling the second capacitor between the output of the DAC and the input of the amplifying circuit; and
coupling the output of the amplifying circuit to the output of the DAC;

during the second sampling phase,
coupling the second capacitor between the output of the DAC and the input of the ADC; and during a second conversion phase,
coupling the second capacitor between the output of the DAC and the ground.

27. The method of claim 26, further comprising:

during each of the first conversion phase and the second conversion phase,
outputting a digital signal to the DAC; and
resolving N bits of the digital signal based on a compare signal from an output of the comparator.

* * * * *